US008762089B2

(12) United States Patent
Takatori

(10) Patent No.: US 8,762,089 B2
(45) Date of Patent: Jun. 24, 2014

(54) METHOD AND APPARATUS FOR TESTING A SUBSTRATE FOR DISPLAY DEVICE

(75) Inventor: Kenichi Takatori, Kawasaki (JP)

(73) Assignee: NLT Technologies, Ltd., Kanagawa (JP)

( * ) Notice: Subject to any disclaimer, the term of this patent is extended or adjusted under 35 U.S.C. 154(b) by 586 days.

(21) Appl. No.: 12/437,996

(22) Filed: May 8, 2009

(65) Prior Publication Data

US 2009/0281754 A1 Nov. 12, 2009

(30) Foreign Application Priority Data

May 9, 2008 (JP) ................................ 2008-123512
Apr. 27, 2009 (JP) ................................ 2009-108253

(51) Int. Cl.
*G06F 19/00* (2011.01)
*G01R 31/305* (2006.01)
*G01R 31/26* (2014.01)

(52) U.S. Cl.
USPC ................. 702/82; 702/81; 702/84; 702/182; 702/183; 324/754.22; 324/760.01; 324/760.02

(58) Field of Classification Search
USPC ........... 702/81, 82, 84, 182, 183; 324/754.22, 324/760.01, 760.02
See application file for complete search history.

(56) References Cited

U.S. PATENT DOCUMENTS 5,982,190 A 11/1999 Toro-Lira
7,212,024 B2 * 5/2007 Iwasaki et al. ........... 324/759.03
2005/0174140 A1 * 8/2005 Iwasaki ......................... 324/770
2008/0088568 A1 * 4/2008 Haga et al. .................... 345/100
2009/0102824 A1 4/2009 Tanaka et al.
2011/0025971 A1 * 2/2011 Fujikawa ...................... 349/149

FOREIGN PATENT DOCUMENTS

| | | | |
|---|---|---|---|
| JP | 2000-003142 | A | 1/2000 |
| JP | 2003-167530 | A | 6/2003 |
| JP | 2005-217239 | A | 8/2005 |
| JP | 2005-259719 | A | 9/2005 |
| JP | 2008-218420 | A | 9/2008 |
| TW | 447052 | B | 7/2001 |
| WO | 2007/105700 | A1 | 9/2007 |

OTHER PUBLICATIONS

Chinese Office Action issued May 28, 2012 in corresponding Chinese Patent Application No. 200910139189.1.
Office Action dated Apr. 15, 2013 issued by the State Intellectual Property Office of the People's Republic of China in corresponding Chinese Patent Application 200910139189.1.
Japanese Office Action issued Nov. 12, 2013 in corresponding Japanese Patent Application No. 2009-108253.

* cited by examiner

*Primary Examiner* — Sujoy Kundu
*Assistant Examiner* — L. Anderson
(74) *Attorney, Agent, or Firm* — Sughrue Mion, PLLC

(57) ABSTRACT

Disclosed is a test method an apparatus in which an area for test and an area for analysis are specified based on the design information of the display device having a non-rectangular display area. To carry out testing, parasitic capacitances are found using the design information, and operations for weighting are performed on test data or threshold values based on which a decision on pass/fail is to be made.

20 Claims, 37 Drawing Sheets

FIG.22

| | | |
|---|---|---|
| $\frac{a_{11}}{n}$ | $\frac{b_{12}}{n}$ | $\frac{a_{13}}{n}$ |
| $\frac{b_{21}}{n}$ | $\frac{c}{n}$ | $\frac{b_{23}}{n}$ |
| $\frac{a_{31}}{n}$ | $\frac{b_{32}}{n}$ | $\frac{a_{33}}{n}$ |

FIG.23

| | | |
|---|---|---|
| $\frac{1}{16}$ | $\frac{2}{16}$ | $\frac{1}{16}$ |
| $\frac{2}{16}$ | $\frac{4}{16}$ | $\frac{2}{16}$ |
| $\frac{1}{16}$ | $\frac{2}{16}$ | $\frac{1}{16}$ |

FIG.24

| | | |
|---|---|---|
| $-k_{11}$ | $-l_{12}$ | $-k_{13}$ |
| $-l_{21}$ | $m$ | $-l_{23}$ |
| $-k_{31}$ | $-l_{32}$ | $-k_{33}$ |

FIG.25

| | | |
|---|---|---|
| 0 | −1 | 0 |
| −1 | 5 | −1 |
| 0 | −1 | 0 |

FIG.34

VERSION
BGNLIB
LIBDIRSIZE
LIBNAME
REFLIBS
FONTS
ATTRTABLE
UNITS
...
CELL STRUCTURE
CELL STRUCTURE
CELL STRUCTURE
...
ENDLIB

METHOD AND APPARATUS FOR TESTING A SUBSTRATE FOR DISPLAY DEVICE

TECHNICAL FIELD

Reference to Related Application

This application is based upon and claims the benefit of the priority of Japanese patent applications No. 2008-123512 filed on May 9, 2009 and No. 2009-108253 filed on Apr. 27, 2009, the disclosured of which are incorporated herein in its entirety by reference thereto.

This invention relates to a technique for testing a substrate for a display. More particularly, it relates to a method and an apparatus for testing a substrate for a display having a non-rectangular display area, and to a substrate for the display.

BACKGROUND

A flat panel display (FPD), such as a liquid crystal display and so forth, employing a TFT substrate, having thereon an array of switching elements, such as thin-film transistors (TFTs), are being put to practical use.

In the liquid crystal display, TFTs, pixel electrodes, a counter-electrode, and the wiring connected thereto, are arranged on a TFT substrate or a counter-substrate opposite to the TFT substrate, with a liquid crystal sandwiched in-between. Whether the counter-electrodes are provided on the TFT substrate or on the counter-substrate depends on the liquid crystal or the display mode used. The TFT substrate is ordinarily a flat plate, such as a glass substrate having a rectangular-shaped display area on which there is formed an array of TFTs, pixel electrodes, storage capacitors and the counter-electrodes, as necessary. There are provided one or more rectangular-shaped panels each including a display area.

FIGS. 28A to 28C are schematic diagrams illustrating a typical TFT PLD disclosed in Patent Document 1. A large number of TFT panels 50 are formed on a sole glass substrate 40 using a lithographic technique and a semiconductor production process (FIG. 28A). Each TFT panel 50 is formed by an array of a large number of pixel electrodes. A large number of pixels 51 are arranged in a matrix configuration of columns and rows, as shown in FIGS. 28B and 28C.

In FIG. 28C, display on each TFT panel 50 is by addressing a row Lr and a column Lc of each pixel 51 by a selection signal.

FIG. 29 shows an illustrative configuration of a TFT panel for display as disclosed in Patent Document 3. Each TFT panel is made up of a thin-film transistor (TFT) a, a pixel electrode b, an odd data line e, an even data line f, an odd gate line c, an even gate line d and a common line g. The data lines e, f and the gate lines c, d cross one another but are not electrically connected one with another. Each TFT a is electrically connected to the data lines e, f and the gate lines c, d. It is observed that there are TFT arrays not having the common line g. In this case, the pixel electrode b is connected via a static capacitance to a neighboring gate line.

In order for the display to be in operation, each TFT must operate normally. Moreover, the voltage must be applied to the pixel electrodes to display a picture. To check for whether or not the voltage is being normally applied to the pixel electrode, the fact that the kinetic energy of secondary electrons which are generated on irradiating charged particles on the pixel electrodes is changed by the voltage of a pixel electrode, may be utilized.

FIG. 30 shows a configuration disclosed in Patent Document 1. Referring to FIG. 30, there is provided an electron beam source 11 that irradiates an electron beam EB on an array substrate 5 of the display. Secondary electrons SE, generated on irradiation of the electron beam, may be detected by an electron detector DE (secondary electron detector). Emission of the secondary electrons SE is directly proportionate to the voltage of a pixel 6 disposed on the substrate emitting the secondary electrons. An output of the electron detector DE represents the voltage of the pixel, as an object under test, and is delivered to a signal generator/signal analyzer 8. A driving signal, supplied to a terminal of a TFT of each pixel, is formed by the signal generator/signal analyzer 8 and transmitted over lines 61, 62 to the pixel 6. This driving signal is scanned in synchronization with scanning of the electron beam EB indicated as double arrows S (refer to Patent Documents 1 and 2). This technique of voltage contrast of the charged particles, also termed the 'electron beam test technique', is a non-contact method for verifying the state of each TFT on the substrate. The technique has an advantage of lower cost in comparison with the conventional test method that uses a mechanical probe, while having an advantage of a faster test speed in comparison with the optical test method.

Based on the disclosure of Patent Document 3, the principle of the voltage technique, which is based on the amount of detection of secondary electrons, is described.

The amount of the secondary electrons, emitted from the pixel electrodes of the TFT substrate to get to the electron detector DE, is dependent on the polarity of the voltage of the pixel electrode. For example, if the pixel electrode is at a positive (plus) potential, the secondary electrons, generated by irradiation of charged particles on the pixel electrodes, are drawn into the pixel electrodes because of the negative (minus) potential of the secondary electrons. As a result, the quantity of the secondary electrons, getting to the electron detector DE, is decreased.

If conversely the pixel electrode has a negative (minus) potential, the generated secondary particles, having charges of the negative potential, and the pixel electrode, repel each other. Hence, the secondary electrons generated get to the electron detector DE without decreasing in their quantity.

The waveform of secondary electrons, corresponding to the voltage waveform of the pixel electrode, may thus be measured by exploiting the fact that the quantity of secondary electrons corresponding to the voltage waveform of the pixel electrode is influenced by the polarity of the voltage of the pixel electrode. The voltage polarity may be positive, negative or zero corresponding to zero-voltage application.

That is, the voltage waveform may be known indirectly, such that, by comparing it to a predicted waveform of the secondary electrons, it may be checked whether or not the voltage is being applied as regularly to the pixel electrode.

The pixel electrode of the TFT array is normally rectangular or polygonal in shape and may be tens to hundreds of micrometers (μm).

The size of the pixel electrode depends on the size and resolution of the display as a completed product. Hence, in testing TFT arrays with differing size and/or resolution, by a sole TFT array test apparatus, it is necessary to test pixel electrodes differing in size.

On the other hand, with a conventional TFT array test apparatus, employing a charged electron beam, a beam of charged particles of a preset diameter is swept on a TFT substrate, and secondary electrons are detected at a preset timing to acquire a waveform of secondary electrons.

FIG. 31A shows a position of a first detection point α1-1 on a pixel electrode at a coordinate position (α1).

FIG. 31B shows a position of a second detection point α1-2. The beam of the charged particles then moves to a pixel electrode at a neighboring coordinate position (β1) to detect a first detection point (β1-1) on the pixel electrode (FIG. 31C).

Figure 31A:
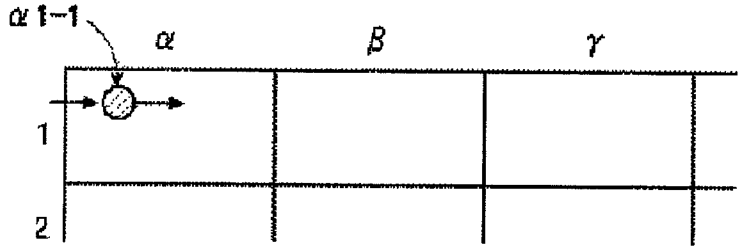
FIG.31A RELATED ART
FIGS. 31A to 31E are diagrams for illustrating the sweeping of the beam of charged particles and detection of secondary electrons. It is observed that these views show the case where four detection points are obtained for one pixel electrode, and that the secondary electrons are detected at the timings and transverse coordinates of the pixel electrodes indicated by α, β and γ
Figure 31B:
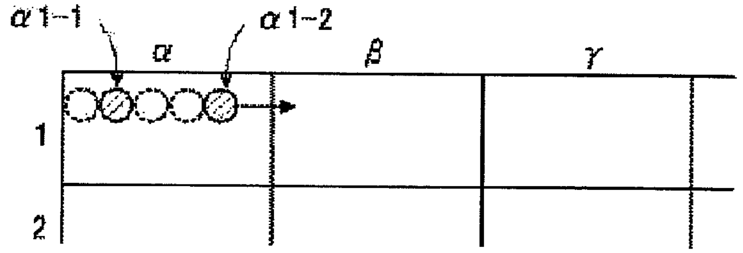
FIG.31B RELATED ART
Figure 31C:
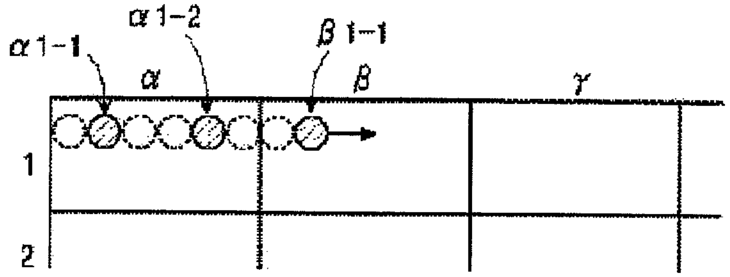
FIG.31C RELATED ART
Figure 31D:
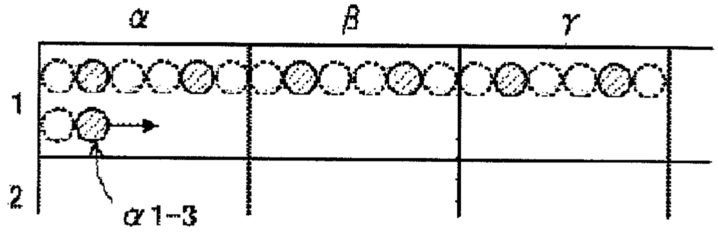
FIG.31D RELATED ART
Figure 31E:
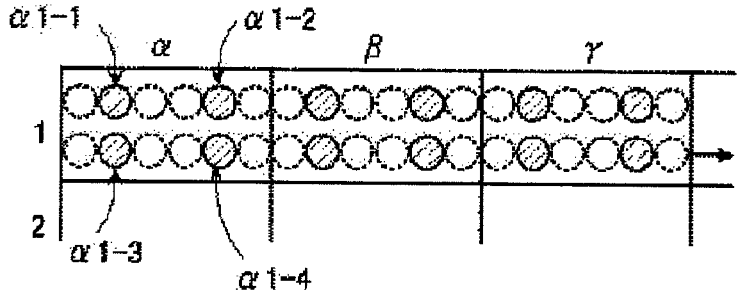
FIG.31E RELATED ART

After the end of the scanning of the first row of the TFT substrate, the beam of the charged particles proceeds to sweeping the second row to detect the secondary electrons at detection points on the pixel electrode (FIGS. 31D and 31E).

By the repetition of detection of the signal of the secondary electrons by this sweeping at preset timings, four points on the pixel electrode may be detected (see internally hatched circles in FIG. 3E).

[Patent Document 1] JP Patent Kokai JP-A-2000-3142

[Patent Document 2] U.S. Pat. No. 5,982,190

[Patent Document 3] JP Patent Kokai JP-A-2005-217239

SUMMARY

The entire disclosures of the above-mentioned Patent Documents 1 to 3 are incorporated herein by reference thereto.

The following is an analysis of the related technique by the present invention.

The first problem is that, with the conventional method and device for testing, it is not possible to efficiently test an array substrate of a display device, in particular an active matrix display, having a non-rectangular display area.

The reason is that a conventional display device usually has a rectangular display area, with the number of active matrix displays having non-rectangular display areas actually in use being only small. Hence, it has not been necessary to test an active matrix display having a non-rectangular display area. Because there lack the necessity, it is not possible to efficiently test the non-rectangular display.

In particular, if a test apparatus for testing the rectangular display area is applied to a display device having a non-rectangular display area, it may sometimes occur that an area other than the display area is taken to be an object under test.

In addition, test results cannot be automatically decided by the functions of the device itself, such that it is necessary to take out test results to outside the test apparatus and to take out the information for the non-rectangular display area from the information of test results of the tested area to verify pass/fail of the so taken-out information.

Hence, testing is necessarily extremely inefficient by the following reasons:

Due to the difference between the rectangular display area and the non-rectangular display area, an area that inherently does not have to be tested is tested.

Since a rectangular display area containing the non-rectangular display area in its entirety is specified, unneeded testing as well as unneeded data storage for other than a pixel area has to be carried out.

It becomes necessary to sort out objects to be inherently tested from the stored data.

Moreover, the objects to be inherently tested need to be tested as to pass/fail in an environment differing from the usual environment, that is, in an area outside the test apparatus.

Moreover, errors in pass/fail decision may be caused because measured data from the area to be inherently tested and those from outside such area exist together.

The second problem is that, in the conventional testing method and device, errors in detection of normal and abnormal pixels may frequently be caused in the testing of an array substrate of a display, in particular an active matrix display, having a non-rectangular display area.

The reason is that, with a display, in particular an active matrix display, having a non-rectangular display area, the numbers of pixels associated with respective signal lines are not the same, in distinction from the display having a rectangular display area.

That is, the numbers of the pixels associated with each wiring, that is, the pixels directly connected to the wiring associated therewith or pixels existing as parasitic capacitances without being directly connected to the wirings, differ from one display area to another, depending on the shape of the display area.

This will now be described with reference to FIG. 27, in which there are shown wirings 271 to 274 in the inside of a display area of the display device having a heart-shaped display area.

Figure 27:
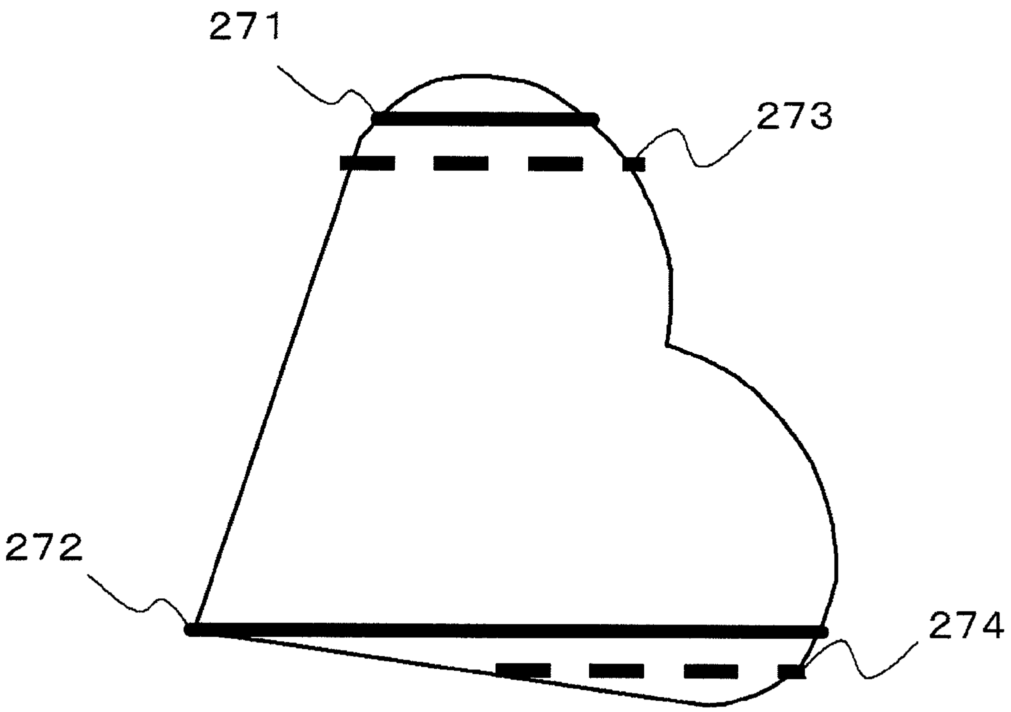

Referring to FIG. 27, attention is directed to the wirings 271 and 272. It is seen from FIG. 27 that the wirings 271 and 272 differ from each other in wiring lengths. The natural consequence of this is that the numbers of pixels connected to these wirings also differ significantly.

In FIG. 27, the length of the wiring 272 is about thrice that of the wiring 271. If the pixels are arrayed at the same pitch, the number of pixels connected directly to the wiring 272 is approximately thrice that connected directly to the wiring 271.

Moreover, the wirings neighboring to the undersides of the wirings 271 and 272 are wirings 273 and 274 shown by broken lines. The wirings 273 and 274 are of approximately the same lengths and the numbers of pixels directly connected to these are also approximately the same.

As a result, the ratio of the lengths of the wirings 271, 272 and that of the pixels directly connected thereto are both 1:3, while that of the numbers of pixels neighboring to the undersides of the wirings and contributing to the parasitic capacitances, is 1:1.

If the numbers of pixels associated differ in this manner, the way in which respective wirings are charged and the signal is propagated over the lines also differs, with the result that the voltage written in respective pixels also differs, even though the signals are written under the same conditions. With differing voltages in the respective pixels, there is produced an error in the determination of normal and abnormal pixels.

Moreover, with a display device having a rectangular display area, the number of pixels existing around a given pixel and contributing to the pixel as parasitic capacitances differs at outer sides and at four corners of the display area.

In case square-shaped pixels are arranged at right angles to one another to form an array, the number of peripheral pixels around each of a non-rim part of the array is eight, while that around each outer side is five and that at each of the four corners is three.

On the other hand, with a display device having a non-rectangular display area, the numbers of the peripheral pixels are widely variable, with the manner of variations differing significantly from the case of a display device having a rectangular display area. For example, if the square-shaped pixels are arranged in a rectangular matrix configuration, the number of peripheral pixels around each pixel is variable and ranges from 1 to 8.

Such difference in the peripheral pixels causes aforementioned parasitic capacitances on the wirings to be varied to influence discrimination between the normal and abnormal pixels.

It may be presupposed that such difference in parasitic capacitances significantly influences secondary electron emission at the time of irradiation of electron beams. This effect is felt to be the cause of frequent occurrence of errors in discrimination between the normal and abnormal pixels.

As another example of the second problem, the problem raised in testing the display device having dummy pixels on the outer peripheral part of the display area may be counted.

The dummy pixels are provided to cope with various problems likely to be produced on the outer peripheral part of the display, for example, disturbed characteristics of the display medium; or non-unified manufacturing process, such as the size or the shape of pixel electrodes at the outer peripheral part of the pixel array differing from those at its non-rim part, thus causing changes in characteristics. These problems arise from the non-unified structure of the pixel array in which the pixels are congested towards an outer rim side display area, with there being no pixels externally of the outer rim side display area.

Thus, such a configuration is used in which dummy pixels are arranged so as to cause various problems to occur only in the dummy pixels or to cause these problems not to be intruded into a display area on an inner side of the dummy pixels. This may prohibit problems from being produced within the display area (see FIG. 33).

Figure 33:
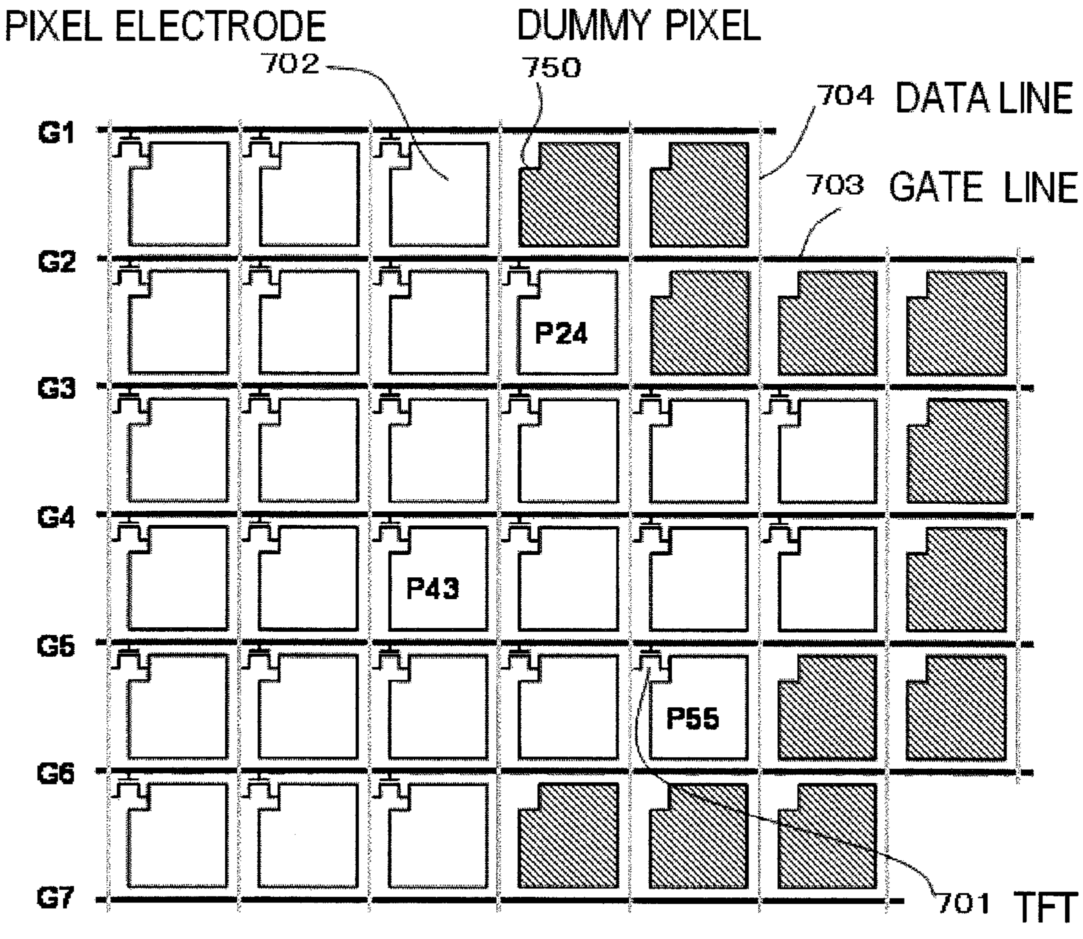

With such dummy pixel 750, an active device, such as TFT 701, is not provided, as shown in FIG. 33. Or, even if the active device, such as TFT, is provided, the active device is not connected to wirings, such as a data line or a gate line.

If, in the dummy pixel 750, there is not provided an active device, such as TFT 701, pixel electrode 702 is directly connected to wirings, such as the data line 704 or the gate line 703, or the pixel electrode is in a floating state without being connected to the wirings. In the example of FIG. 33, the pixel electrode 702 of the dummy pixel 750 is in a floating state.

In case the pixel electrode of the dummy pixel 750 is in the floating state, it is not possible to control the potential of the pixel electrode 702 by the data line 704 or the gate line 703. Hence, the potential of the pixel electrode 702 of the dummy pixel 750 is determined by, for example, the electric charge stored by some reason at the pixel electrode 702 of the dummy pixel 750.

If an electron beam, for example, is irradiated on the dummy pixel 750, during testing, the value of the stored electric charge is readily varied such as to vary the potential of the pixel electrode 702. Hence, the dummy pixel 750 may not uniquely be determined to be a defective or non-defective pixel. For example, a defective pixel may be determined to be a non-defective pixel (PASS), while a non-defective normal pixel may be determined to be a defective pixel (FAIL). As a result, it is difficult with the conventional test method to distinguish between the normal pixel and dummy pixel.

In particular, if there is a non-rectangular display area, it is extremely difficult to determine to where the normal pixel or the dummy pixel exist.

On the other hand, if the pixel electrode of a dummy pixel is directly connected to the data line or the gate line, a dummy pixel part (area of the dummy pixels) may not be controlled via an active device, with the result that the data and gate lines cannot be electrically isolated from the pixel electrode. Thus, in testing a pixel part, the potential of the pixel electrode of the dummy pixel tends to be varied in dependence upon the signal delivered to the data line or the gate line. As a result, it depends on the signal used during measurement whether a pixel is determined to be a pass pixel or a failed pixel during testing.

The dummy pixel may be configured similarly to the normal pixel. That is, there are cases where the dummy pixel is also provided with an active device, such as a TFT, and the data line and the gate line are connected to the active device. In such case, only specified data may sometimes be restrictively supplied to the data line. However, if the dummy pixel part is of a structure similar to the normal pixel part, in this manner, it is particularly difficult to distinguish between a dummy pixel and a normal pixel.

Anyhow, it is difficult to correctly determine a dummy pixel as such, thus deterring simplifying the testing of the display substrate.

If the dummy pixel part is treated as a dummy pixel, and a pass/fail decision is to be given correctly, the test time or the memory capacity is increased for giving such a decision, thereby increasing test cost. In addition, the information regarding the dummy pixel part has to be deleted from the test information of the display area of a product by an additional painstaking operation.

The third problem is that, in testing an array substrate of a display, in particular an active matrix display, having a non-rectangular display area, by the conventional test method and device, troubles frequently occur in testing pixels at the outer rim of the display area.

The reason is that, with the display having a non-rectangular display area, the pixel electrodes on the outer peripheral part of the display area frequently differ in size and/or shape.

In a conventional display having a rectangular display area, an array of pixels has a repetitive pattern of rectangular areas, each made up of a single pixel or a set of a plurality of, usually three, pixels. These three pixels correspond to three prime colors.

In an array of pixels, termed a delta layout, a set of three pixels of different colors constitutes a triangular shape, each vertex of which corresponds to the center of gravity of each pixel.

This repetitive pattern is made up of two triangular shapes, one having a vertex directing upwards and the other having a vertex directing downwards. As a principle, there is no pattern other than these two patterns.

On the other hand, with a display having a non-rectangular display area, a non-rectangular shape of the entire display area is prioritized, in many cases, with the shape and/or the size of the pixels differing at the outer peripheral part of the display area. This is in contrast to the rectangular display area.

In case a rectangular-shaped pixel is used at an outer peripheral part of the non-rectangular display area, the shape of the outer peripheral part of the display area is mismatched to the pixel shape, such that there may be noticed jaggies caused by the array of mismatched pixels, for example, leading to a shape like a curve with a plurality of line segments crossing one another.

The jaggy feeling appreciably degrades the design effect obtained from the non-rectangular display area of the display having a non-rectangular display area.

These jaggies also attract attention equivalently to the display area inherently desired to be viewed, thus detracting from the effect of information presentation.

In light of the above, the shape and/or the size of the pixels at the outer peripheral part of the display having a non-rectangular display area is modified to conform to the shape of the outer peripheral part.

As a result, when an electron beam similar to that of the pixels at the non-rim part is irradiated to the rim part pixels, such phenomena as differing amounts of generation of secondary electrons;

differing number of times if irradiation (number of points) of the electron beams; or non-irradiation of the electron beam; may be met.

As a result, normal and abnormal pixels cannot be discriminated satisfactorily one from another, or testing cannot be conducted.

The fourth problem is that, if, in a conventional method and device for testing, the pixel repetitive pattern of an array substrate of a display, in particular an active matrix display, having a non-rectangular display area, differs from that of the display having a non-rectangular display area, it is not possible to conduct the testing.

In a conventional display having a non-rectangular display area, pixels are arrayed along two perpendicular axes at equal intervals from one another. In a delta layout, there are upwardly convex and downwardly convex repetitive patterns. The axes of the layout are two perpendicular axes and other two perpendicular axes translated from the first-stated two perpendicular axes.

Thus, in the case of testing pixels, using electron beams, irradiation of electron beams, readout of secondary electrons, decision of measured results and interpretation are based on orthogonal coordinates.

On the other hand, in a display having a non-rectangular display area, pixels may be arrayed to a shape which assists in demonstrating design effects in the non-rectangular display area. For example, a repetitive pattern of several non-rectangular pixels is arrayed along two or three non-perpendicular axes. In this case, the non-rectangular pixels are mirrored on the left and right sides of a centerline. Hence, the pixel shapes differ one from another and, in many cases, are not overlapped on translation or rotation.

In similar manner, pixels may be arrayed in a point-symmetric manner with respect to a certain point. Or, pixels may be arrayed on a rotational axis about a given point as center, or arrayed at random.

These variable layouts are not presupposed and hence cannot be tested in conventional test apparatus, It is therefore a principal object of the present invention to provide a method and a device for testing with which it is possible to test a substrate of the display with a non-rectangular display area as well as to elevate test efficiency.

The present invention, seeks to solve one or more of the above mentioned problems, provides a method and an apparatus having substantially the following configuration.

In one aspect of the present invention, a non-rectangular display area, as an object under test, is specified with the aid of the design information of a substrate of a display having a non-rectangular display area (array substrate). An area for analysis of test results is also specified using the design information on the array substrate of a display having a non-rectangular display area.

In another aspect of the present invention, operations for weighting respective pixels under test and respective wirings connected to the pixels under test are carried out. For example, the weighting information is generated for respective pixels under test, and operations are carried out on the weighting information and on the detection signal obtained on testing. The so weighted test signal is compared to the threshold value that governs pass/fail decision, in order to give a pass/fail decision of the pixels under test.

In a further aspect of the present invention, operations for weighting the threshold value that governs the decision in pass/fail of each pixel under test are carried out using the design information of an array substrate of a display having a non-rectangular display area. For example, the weighting information is generated for each pixel under test, and put to operations, together with the weighting information, to weight the threshold value that governs the decision in pass/fail of each pixel under test. A decision on pass/fail of a pixel under test is given by comparing the detection signal at the time of testing to the weighted threshold value.

In a further aspect of the present invention, the array substrate of the display having a non-rectangular display area is scanned using a beam angle or the beam intensity different from those for normal testing, thereby obtaining the information regarding the shape of the display area on the array substrate as well as the pixel layout information.

The non-rectangular area to be put to fail test is also set using the information regarding the shape of the display area of the array substrate and the pixel layout information acquired.

The area for analysis of test results is set using the information regarding the shape of the display area of the array substrate and the pixel layout information acquired. Also, the manner for scanning a test beam, that is, the scan direction, beam size or the beam shape, is set, again using the information regarding the shape of the display area of the array substrate and the pixel layout information acquired.

According to the present invention, the display having a non-rectangular display area may be tested efficiently by specifying the area for test using the design information.

The meritorious effects of the present invention are summarized as follows.

According to the present invention, in which the area for analysis is specified using the design information, it is possible to analyze test results efficiently, and to further improve test efficiency.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

Figure 1:
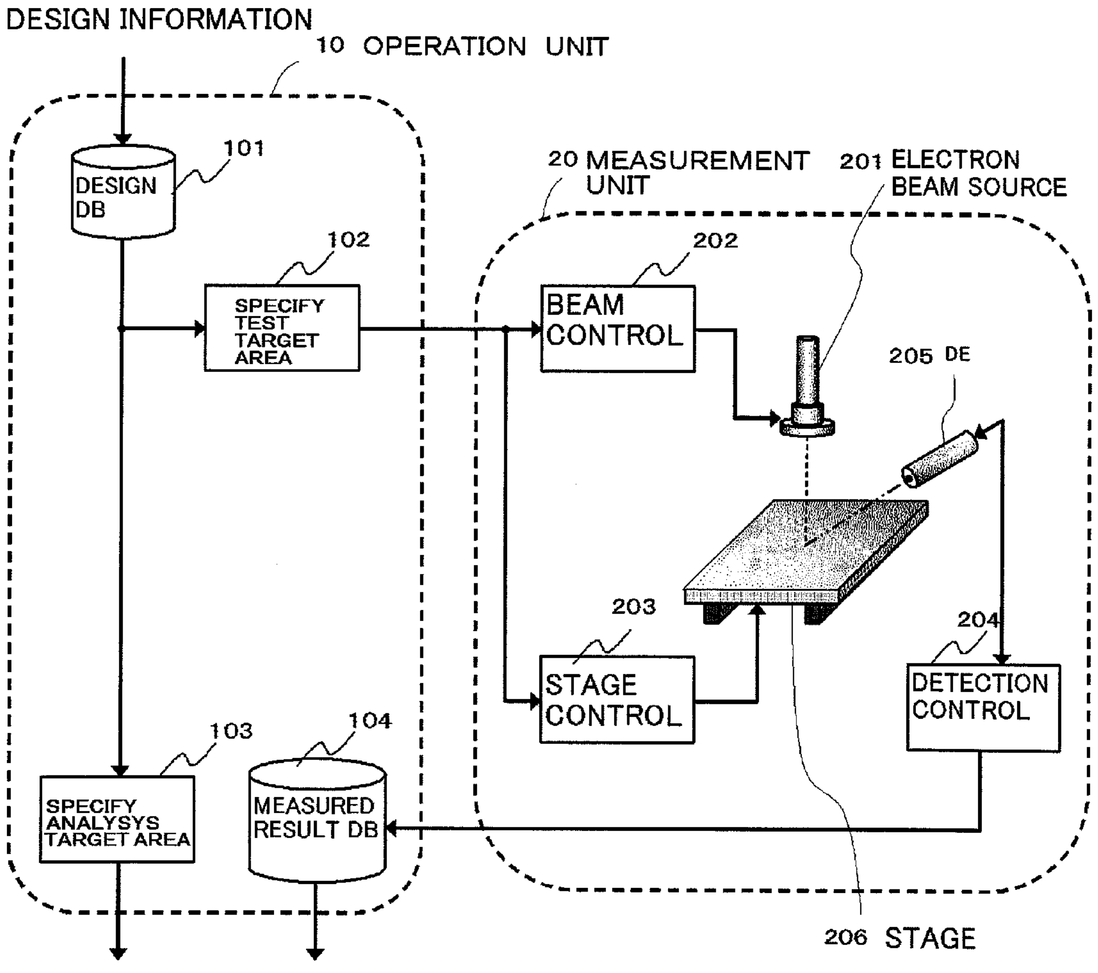

FIG. 1 is a block diagram for illustrating a configuration of an Exemplary Embodiment 1 of the present invention.

Figure 2:
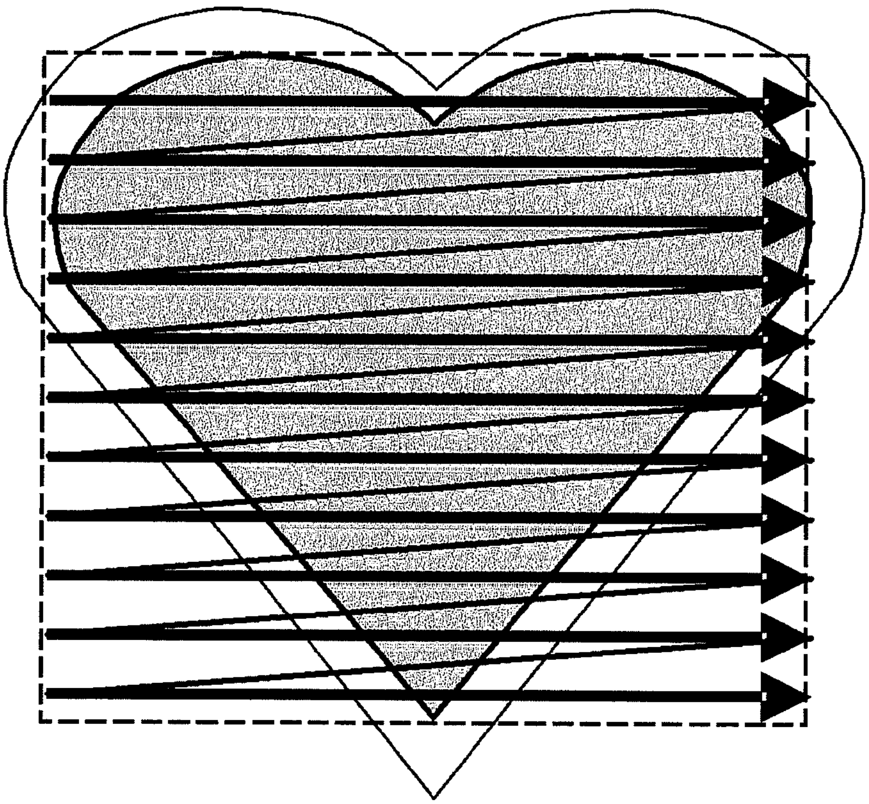

FIG. 2 is a schematic view showing a typical operation of a beam in testing a non-rectangular display device in a Comparative Example.

Figure 3:
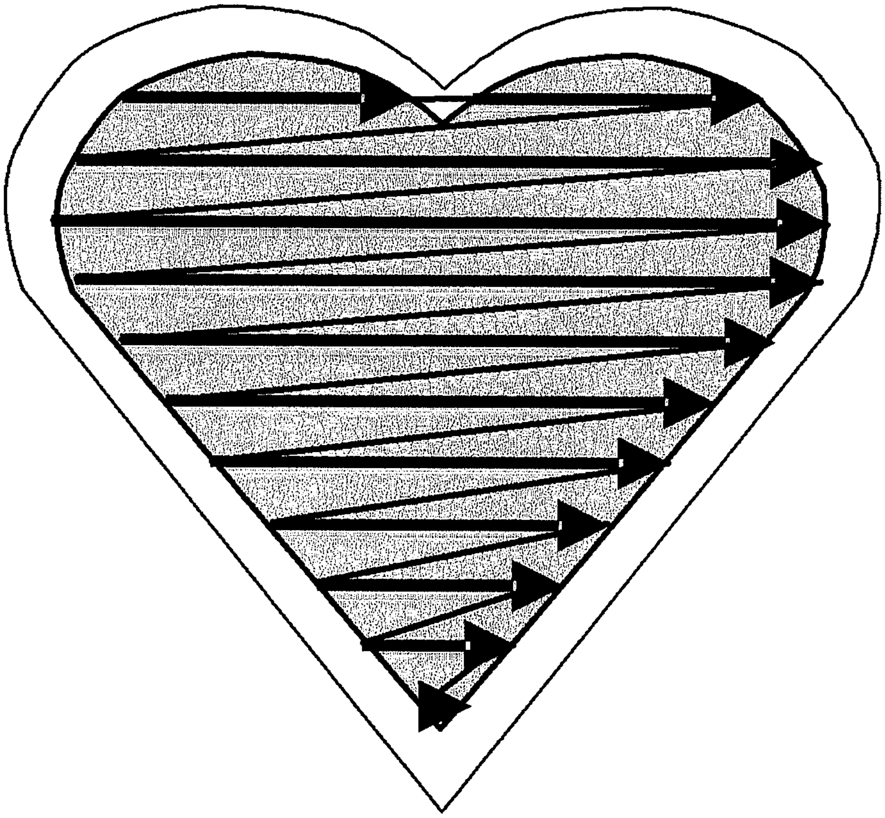

FIG. 3 is a schematic view showing a typical operation of a beam in testing a non-rectangular display in the Exemplary Embodiment 1 of the present invention.

Figure 4:
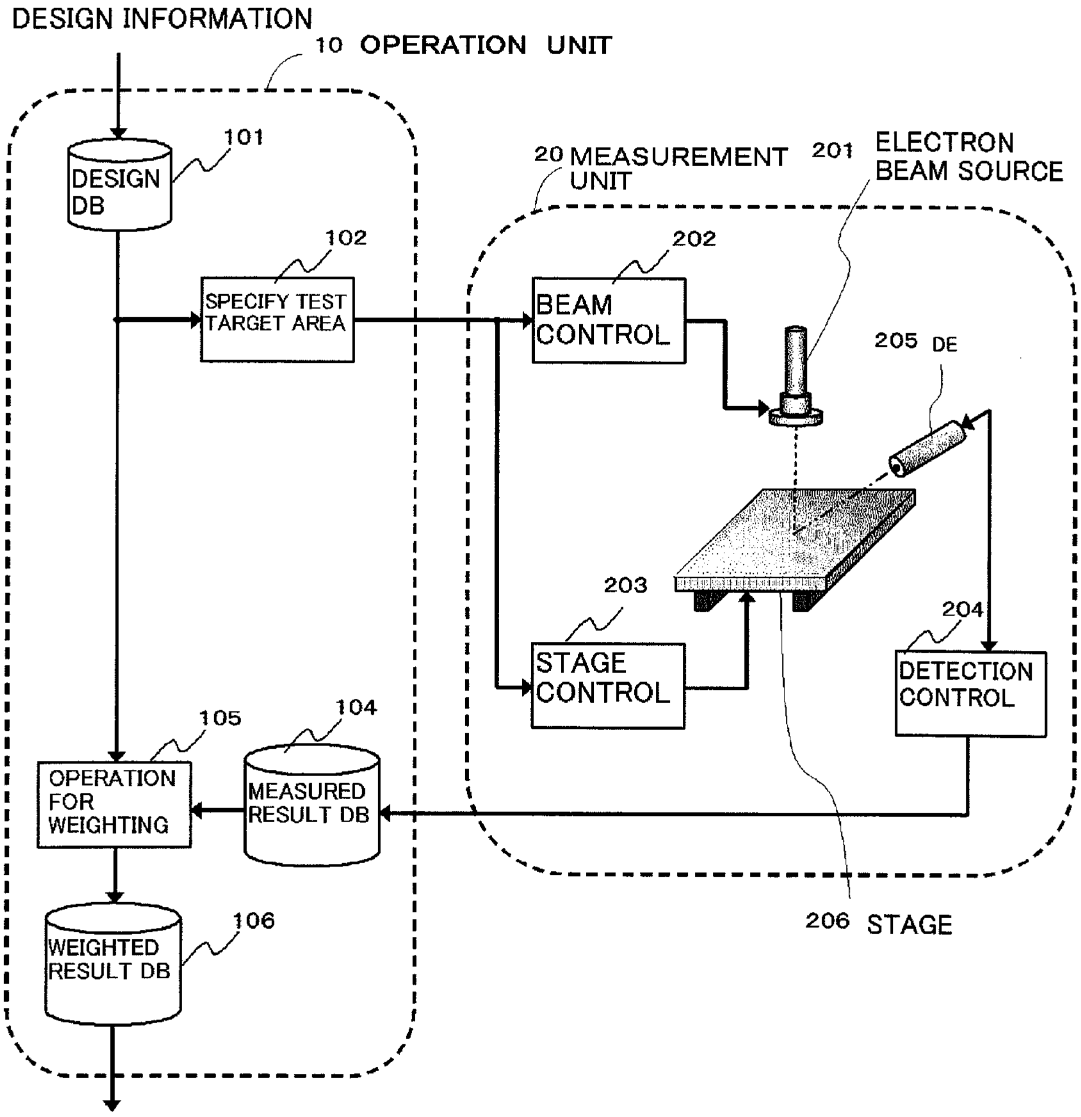

FIG. 4 is a block diagram for illustrating a configuration of an Exemplary Embodiment 2 of the present invention.

Figure 5:
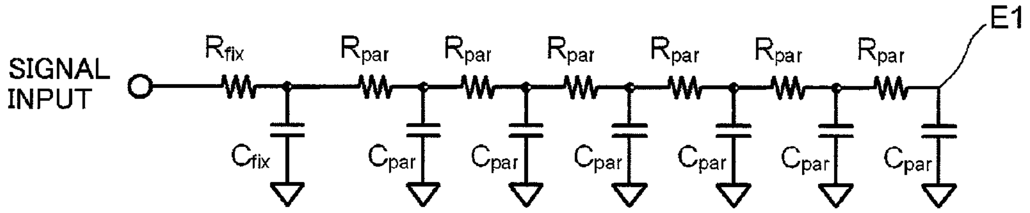

FIG. 5 is a block diagram for illustrating the parasitic capacitances of the wirings and pixel electrodes connected to the wirings in terms of resistances and capacitances.

Figure 6:
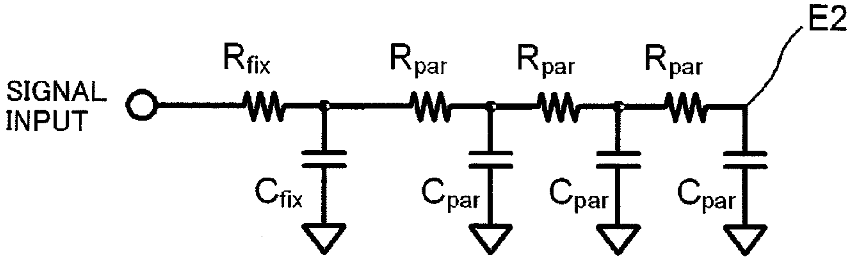

FIG. 6, similarly to FIG. 5, is a block diagram for illustrating the parasitic capacitances of the wirings and pixel electrodes connected to the wirings in terms of resistances and capacitances.

Figure 7:
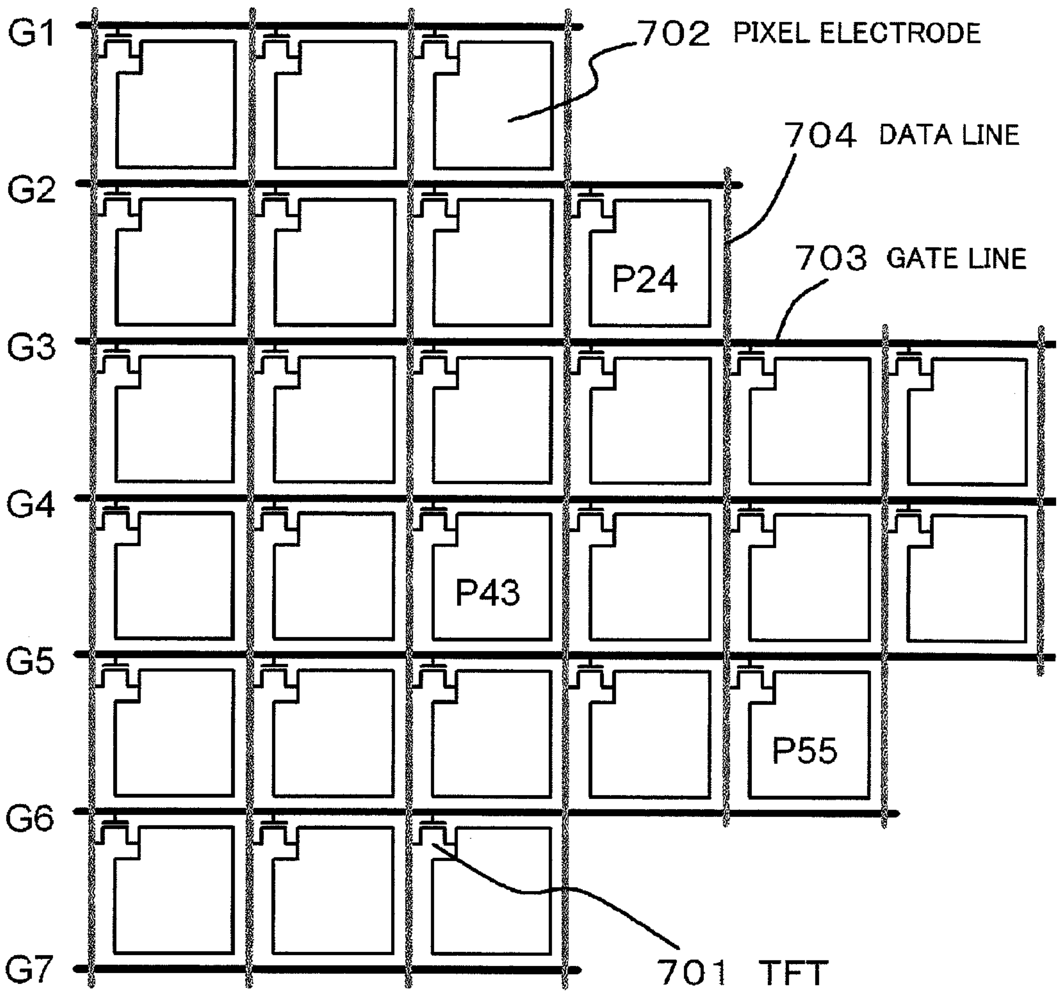

FIG. 7 is a schematic view showing wirings and pixels at an end part of a non-rectangular display area.

Figure 8:
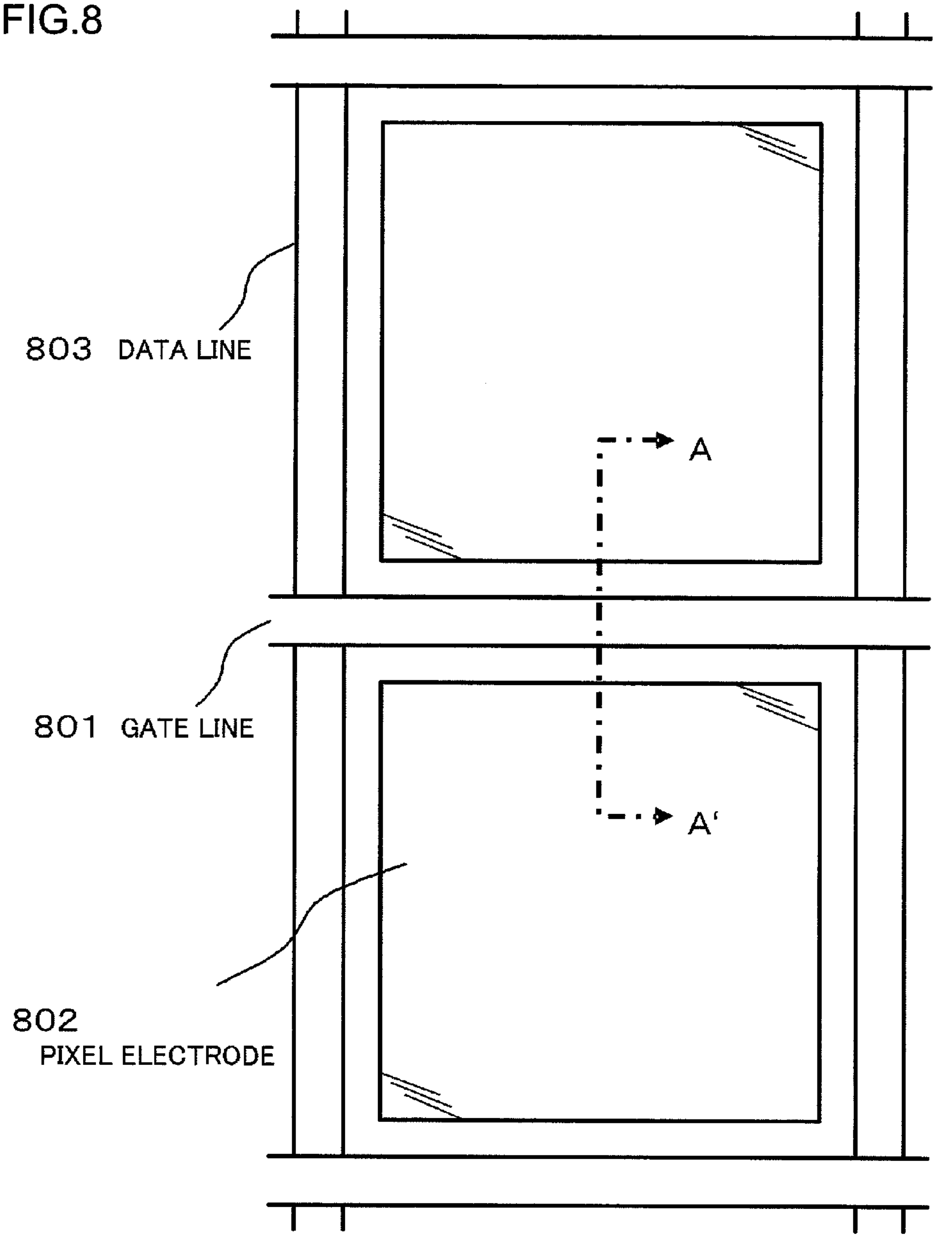

FIG. 8 is a schematic view showing the layout of wirings and pixel electrodes of a substrate of a display.

Figure 9:
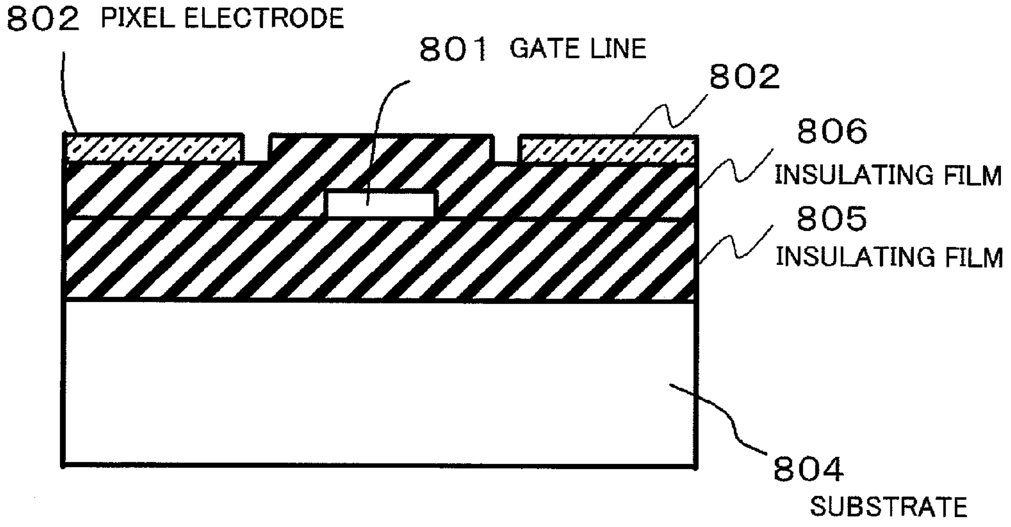

FIG. 9 is a cross-sectional view taken along line A-A' of FIG. 8.

Figure 10:
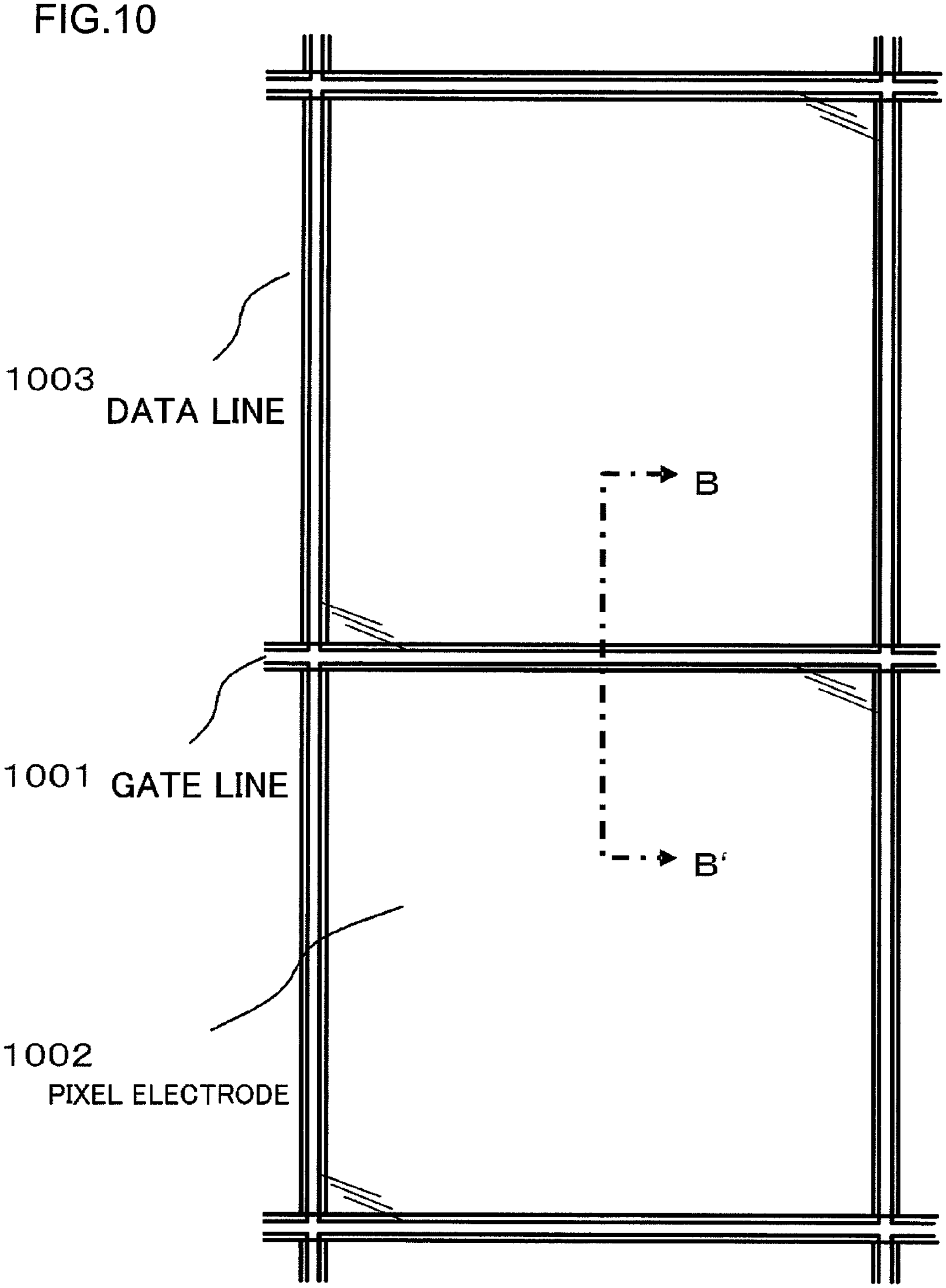

FIG. 10, similarly to FIG. 8, is a schematic view showing the layout of wirings and pixel electrodes of a substrate of a display.

Figure 11:
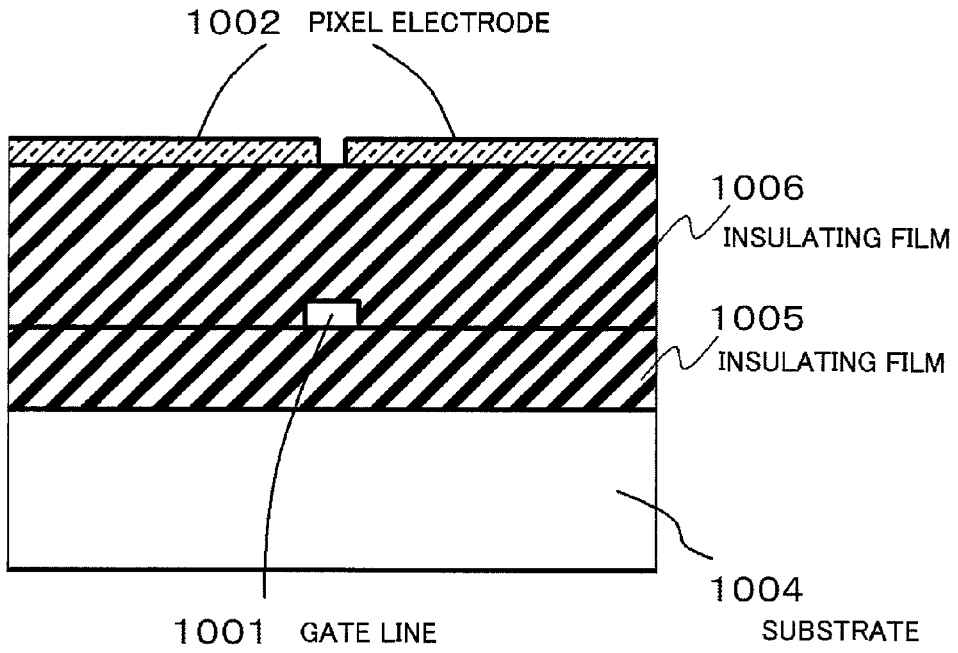

FIG. 11 is a cross-sectional view taken along line B-B' of FIG. 10.

Figure 12:
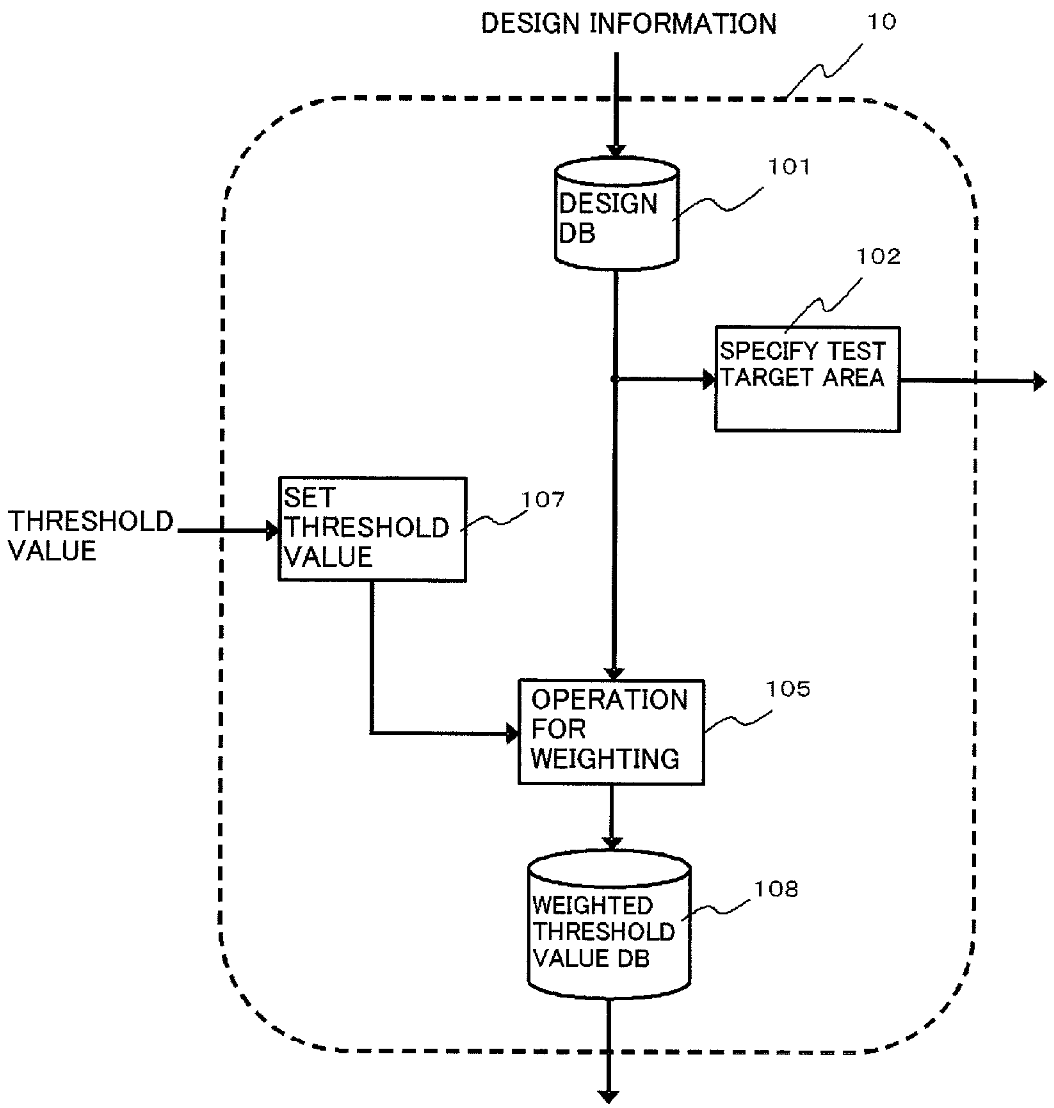

FIG. 12 is a block diagram for illustrating a configuration of an Exemplary Embodiment 4 of the present invention.

Figure 13:
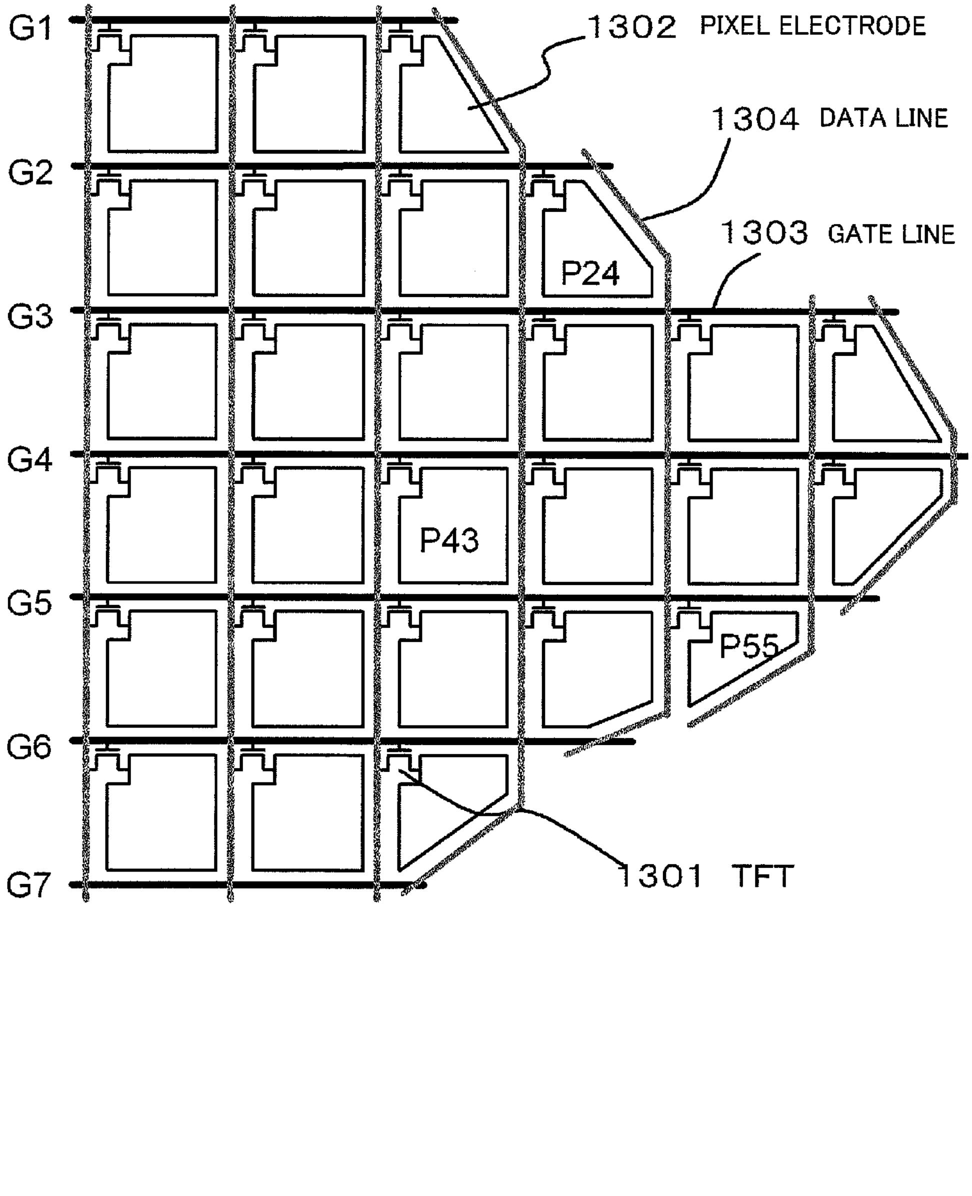

FIG. 13, similarly to FIG. 7, is a schematic view showing wirings and pixels at an end part of a non-rectangular display area.

Figure 14:
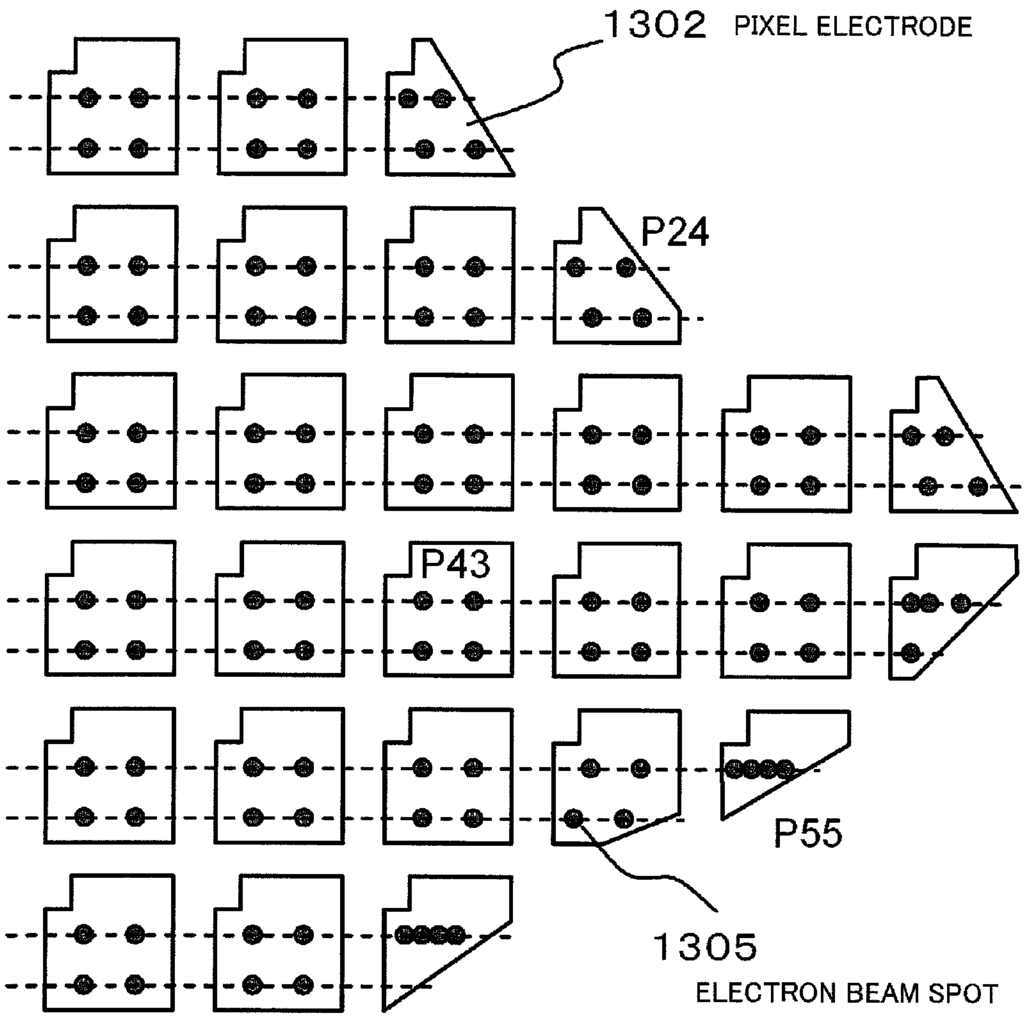

FIG. 14 is a schematic view showing electron beam spots for testing of FIG. 13.

Figure 15:
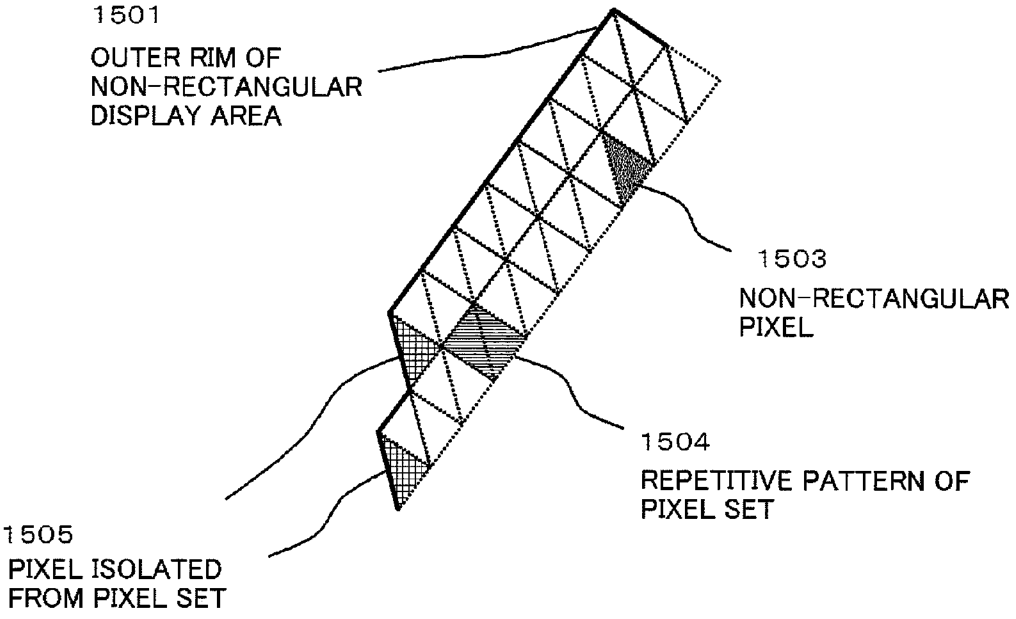

FIG. 15 is an enlarged view showing an outer rim of the non-rectangular display area.

Figure 16:
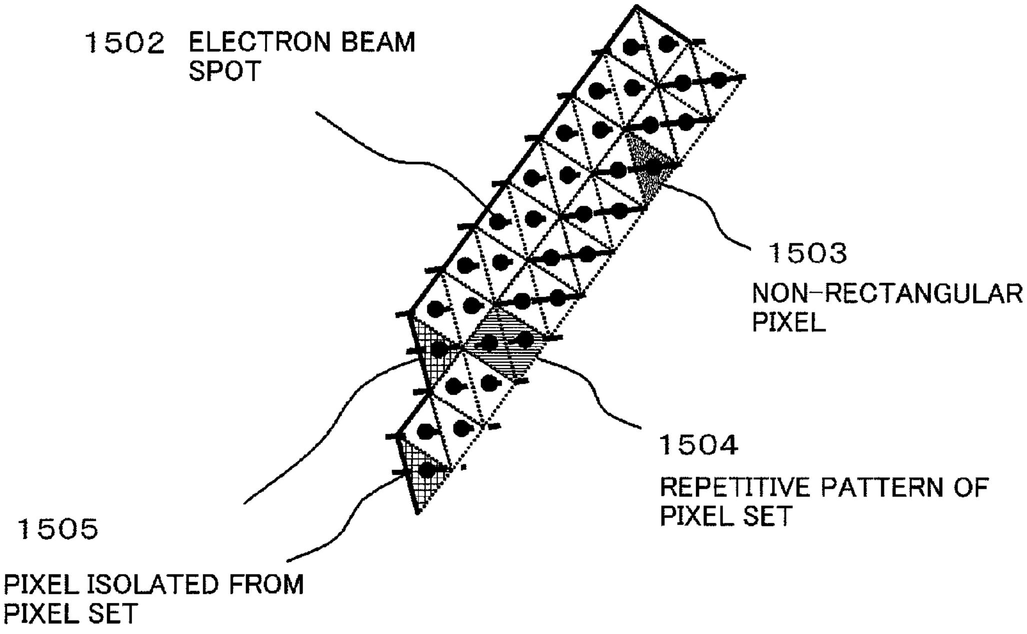

FIG. 16 is a schematic view showing an example of layout of electronic beam spots in FIG. 15.

Figure 17:
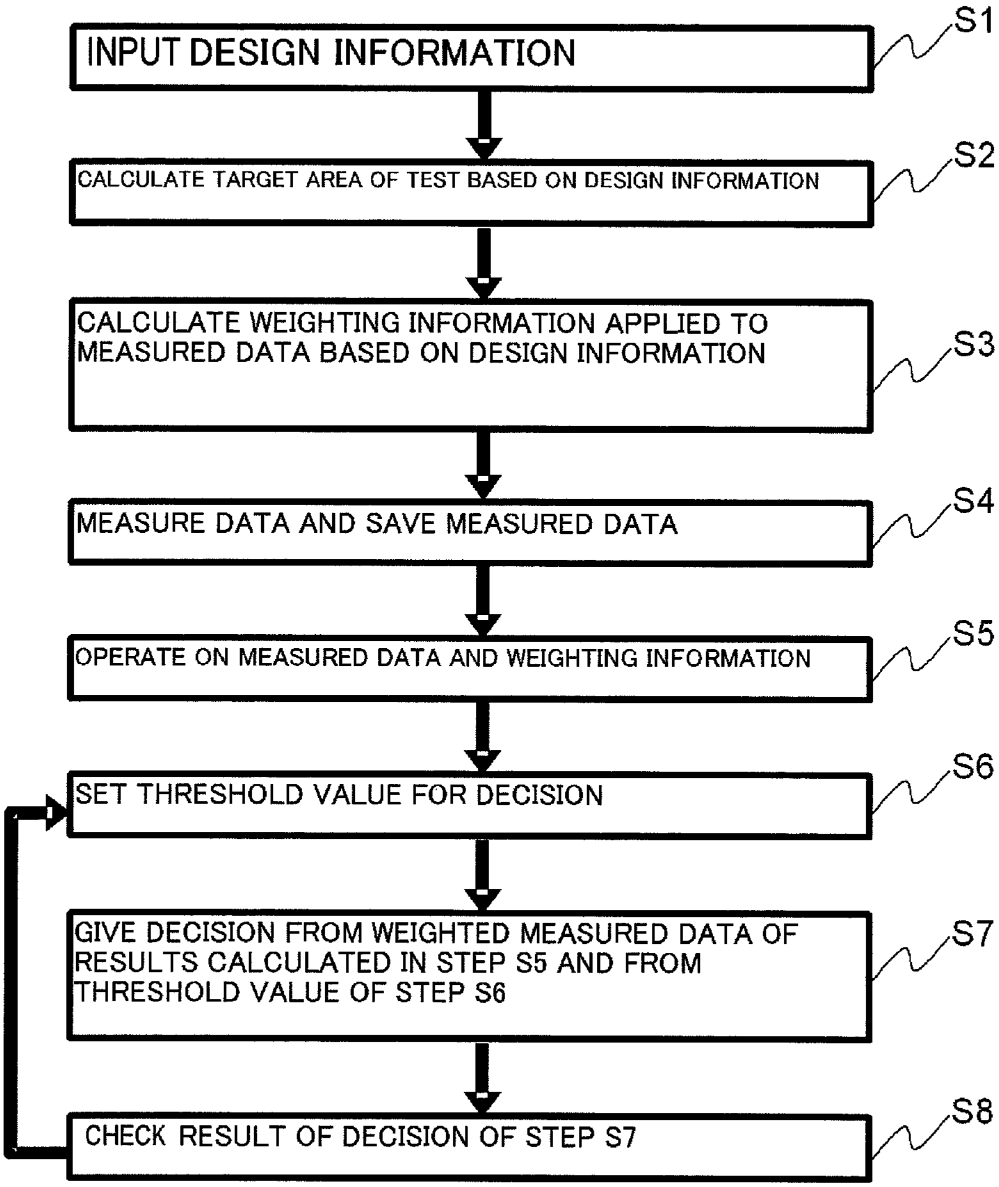

FIG. 17 is a flowchart for illustrating the test sequence of a test conducted with a test apparatus in an Exemplary Embodiment 7 of the present invention.

Figure 18:
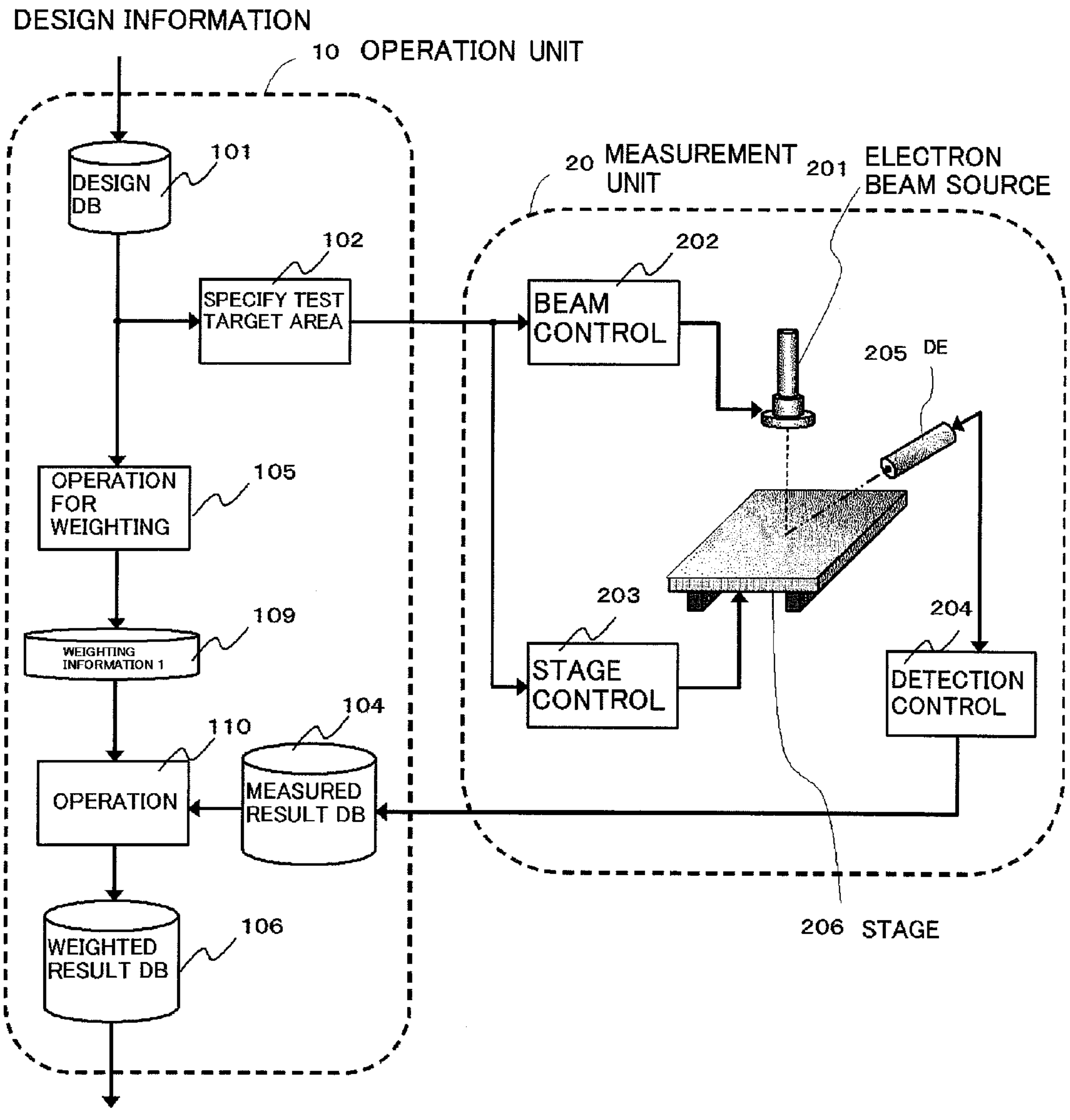

FIG. 18 is a block diagram showing an operation unit and a measurement unit of a test apparatus of the Exemplary Embodiment 7.

Figure 19:
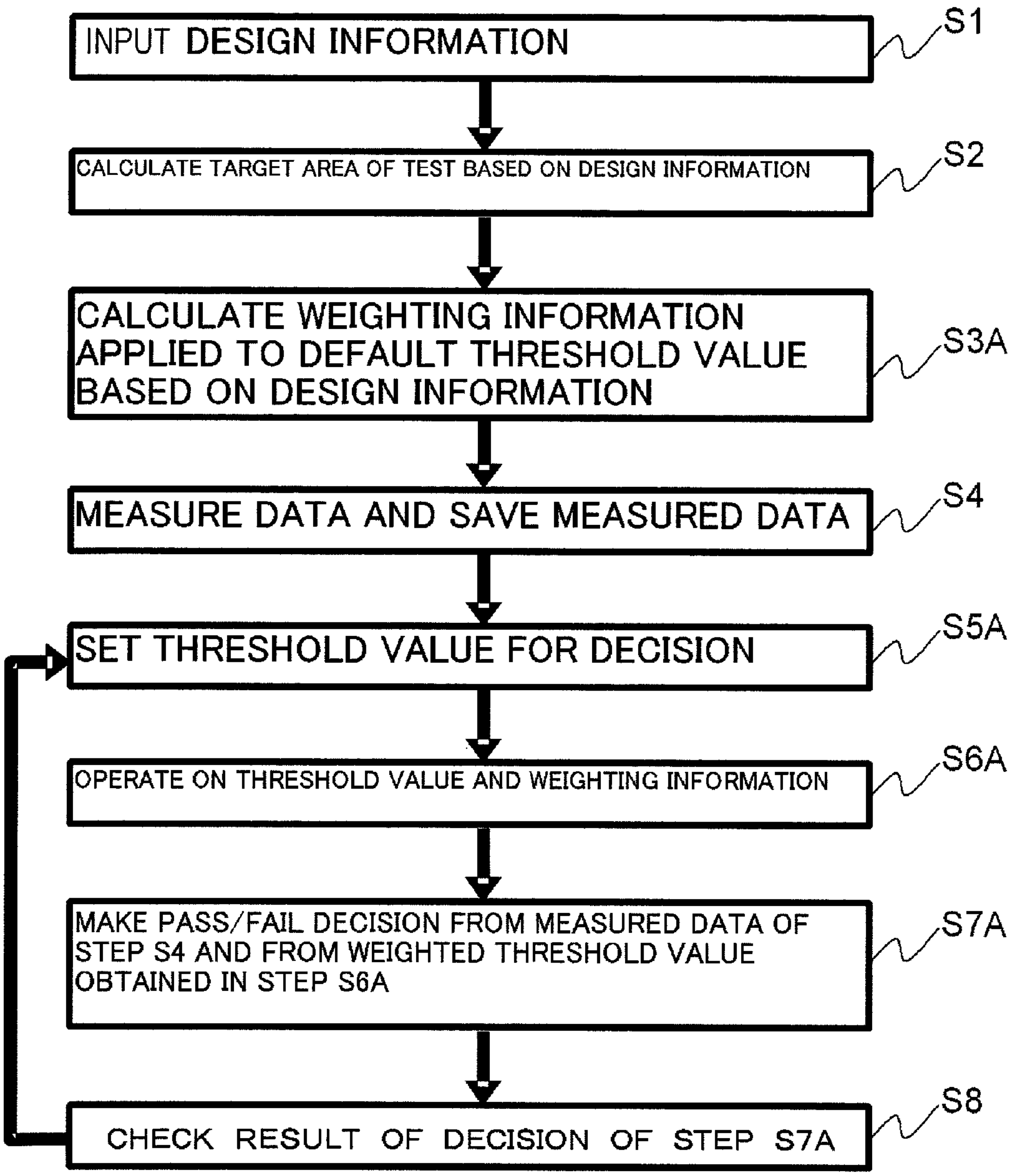

FIG. 19 is a flowchart for illustrating the test sequence of a test conducted with a test apparatus of an Exemplary Embodiment 8 of the present invention.

Figure 20:
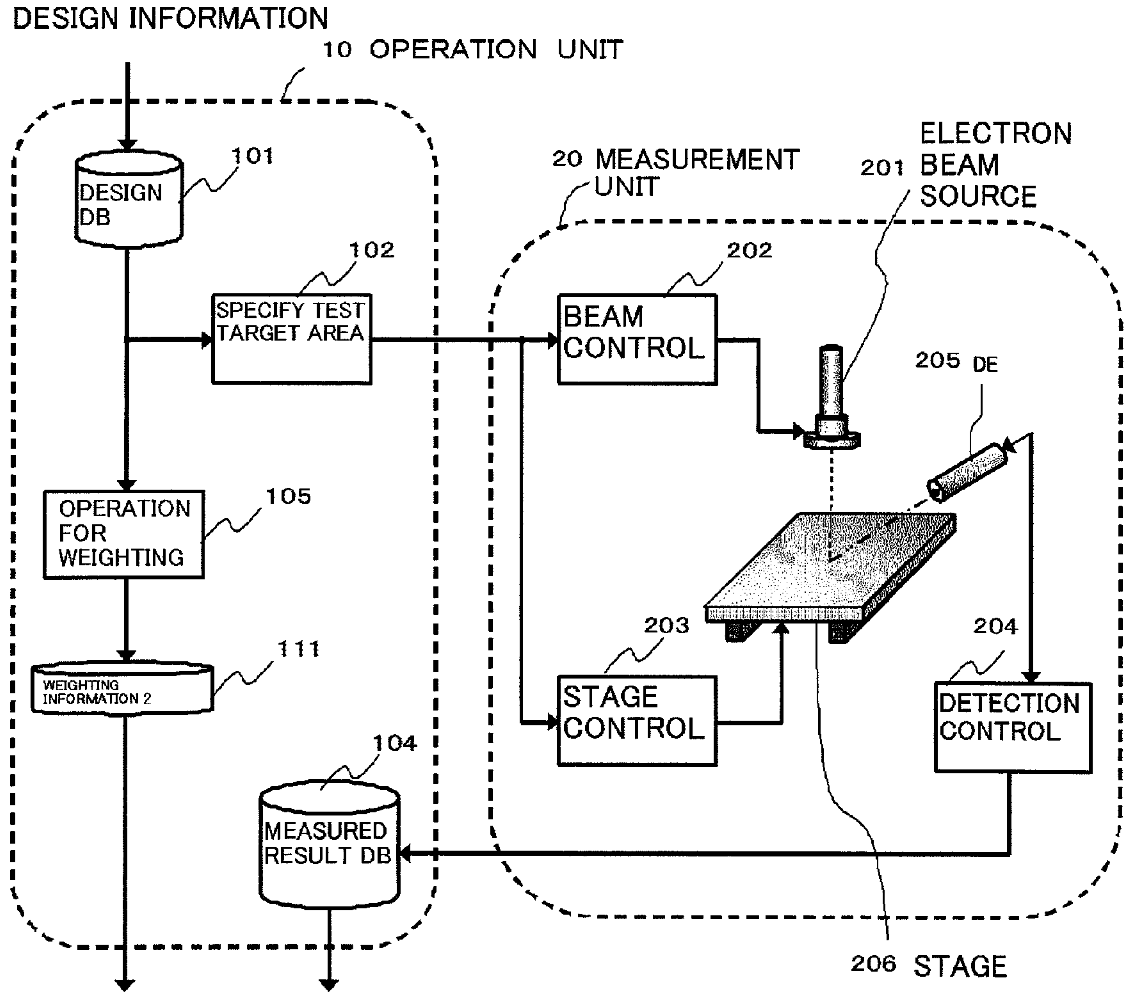

FIG. 20 is a block diagram showing an operation unit and a measurement unit of a test apparatus of the Exemplary Embodiment 8.

Figure 21:
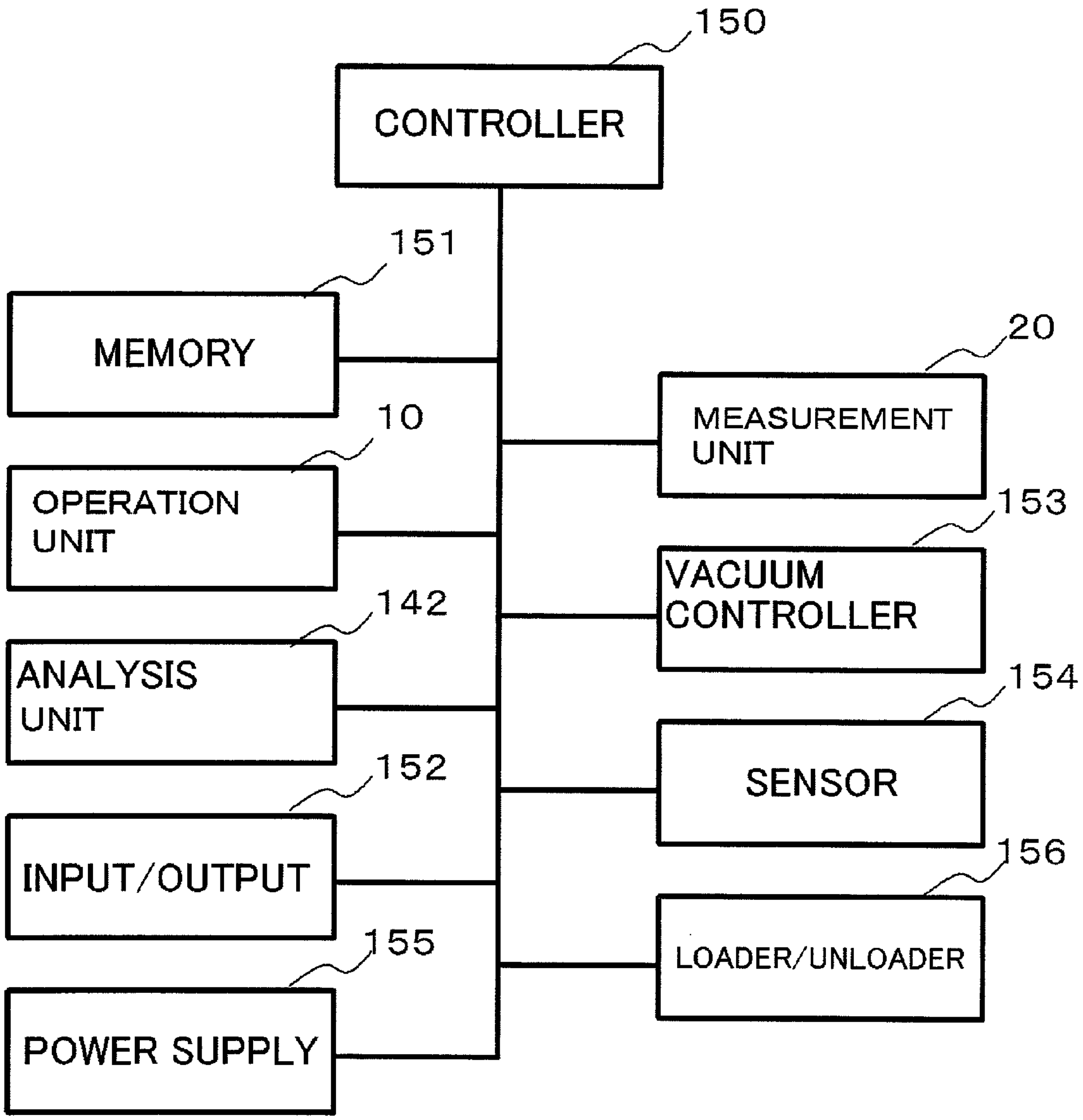

FIG. 21 is a block diagram illustrating a configuration of a test apparatus according to the Exemplary Embodiments 7 and 8 of the present invention.

FIG. 22 is a schematic view showing specified examples of weighting of a center pixel and eight neighboring pixels according to the present invention.

FIG. 23 is a schematic view showing example numerical values used in FIG. 22.

FIG. 24 is a schematic view showing specified examples of weighting of a center pixel and eight neighboring pixels according to the present invention.

FIG. 25 is a schematic view showing example numerical values used in FIG. 24.

Figure 26:
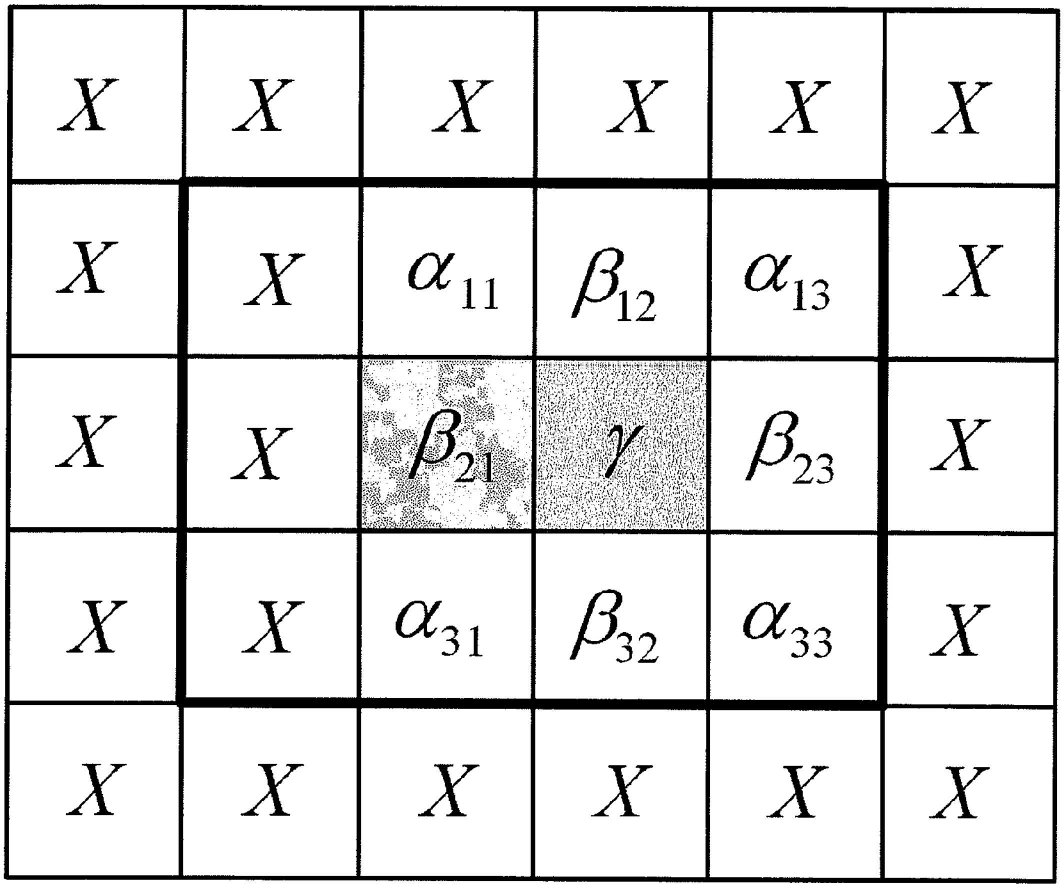

FIG. 26 is a schematic showing data detected in a 5×6 array according to the present invention.

FIG. 27 is a schematic view showing an example of a display device having a non-rectangular display area.

Figures 28A, 28B, 28C:
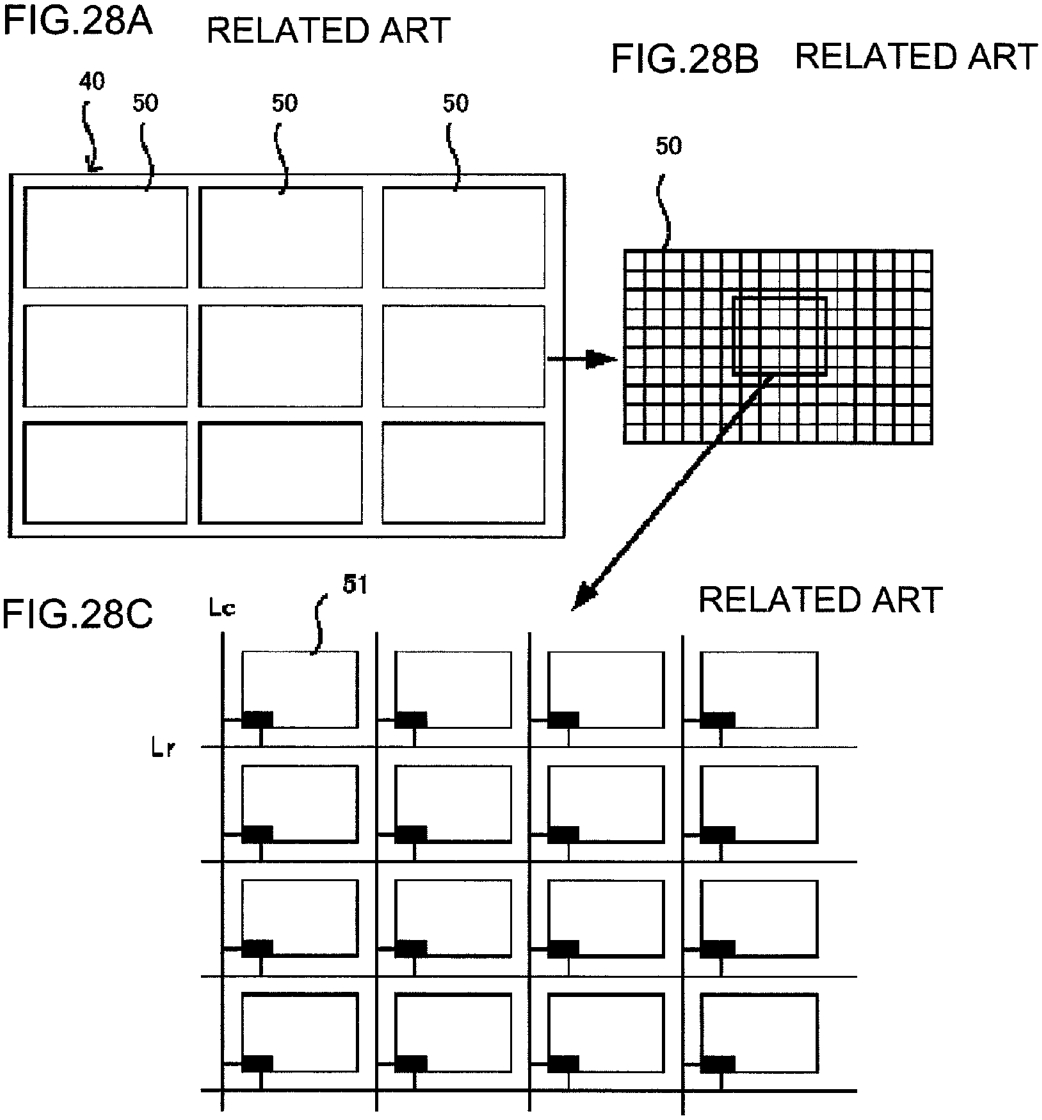
FIG.28A RELATED ART
FIG.28B RELATED ART
FIG.28C RELATED ART

FIGS. 28A to 28C are diagrams showing a conventional typical TFT (thin film transistor) flat panel display device.

Figure 29:
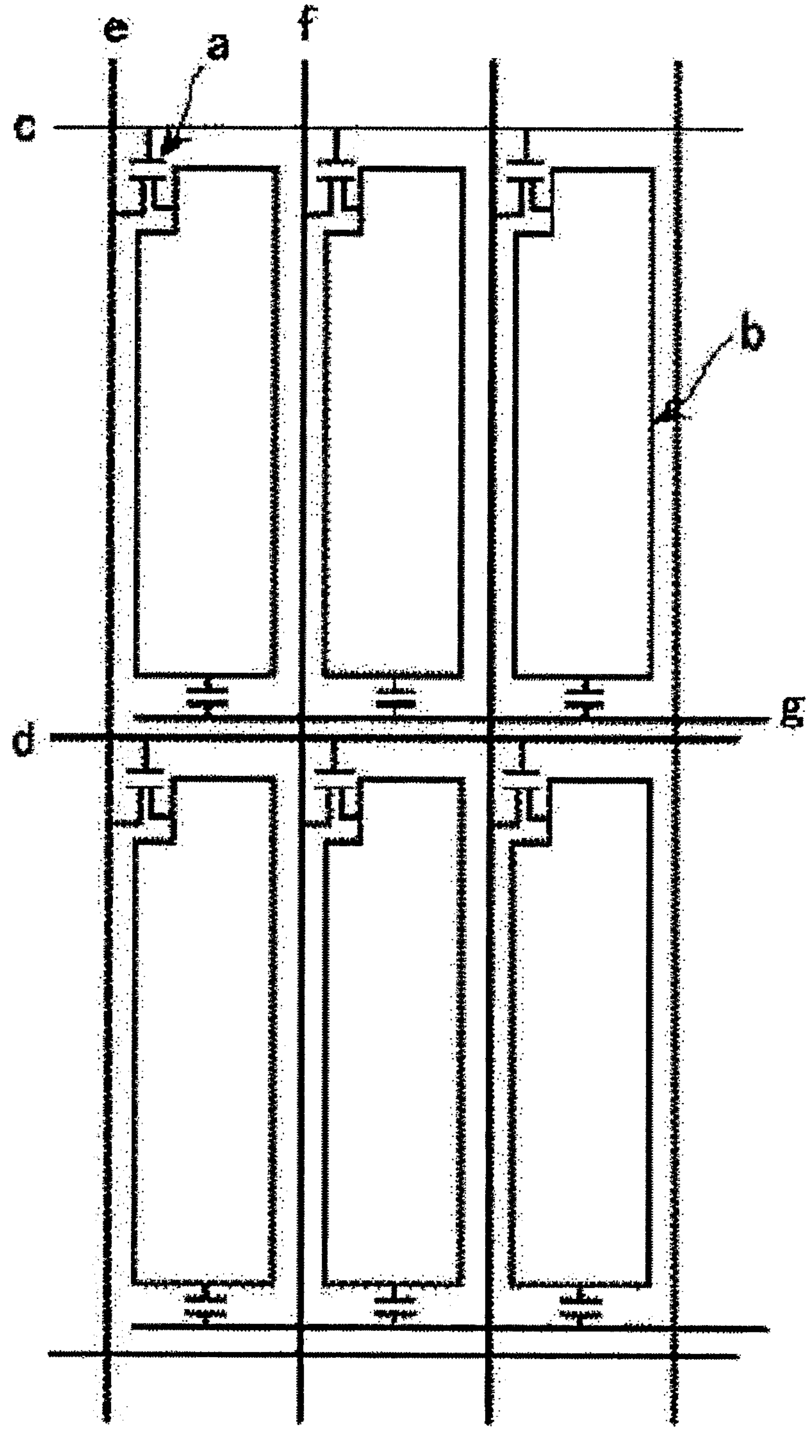
FIG.29 RELATED ART

FIG. 29 is a schematic view showing an example of a typical configuration of a display device.

Figure 30:
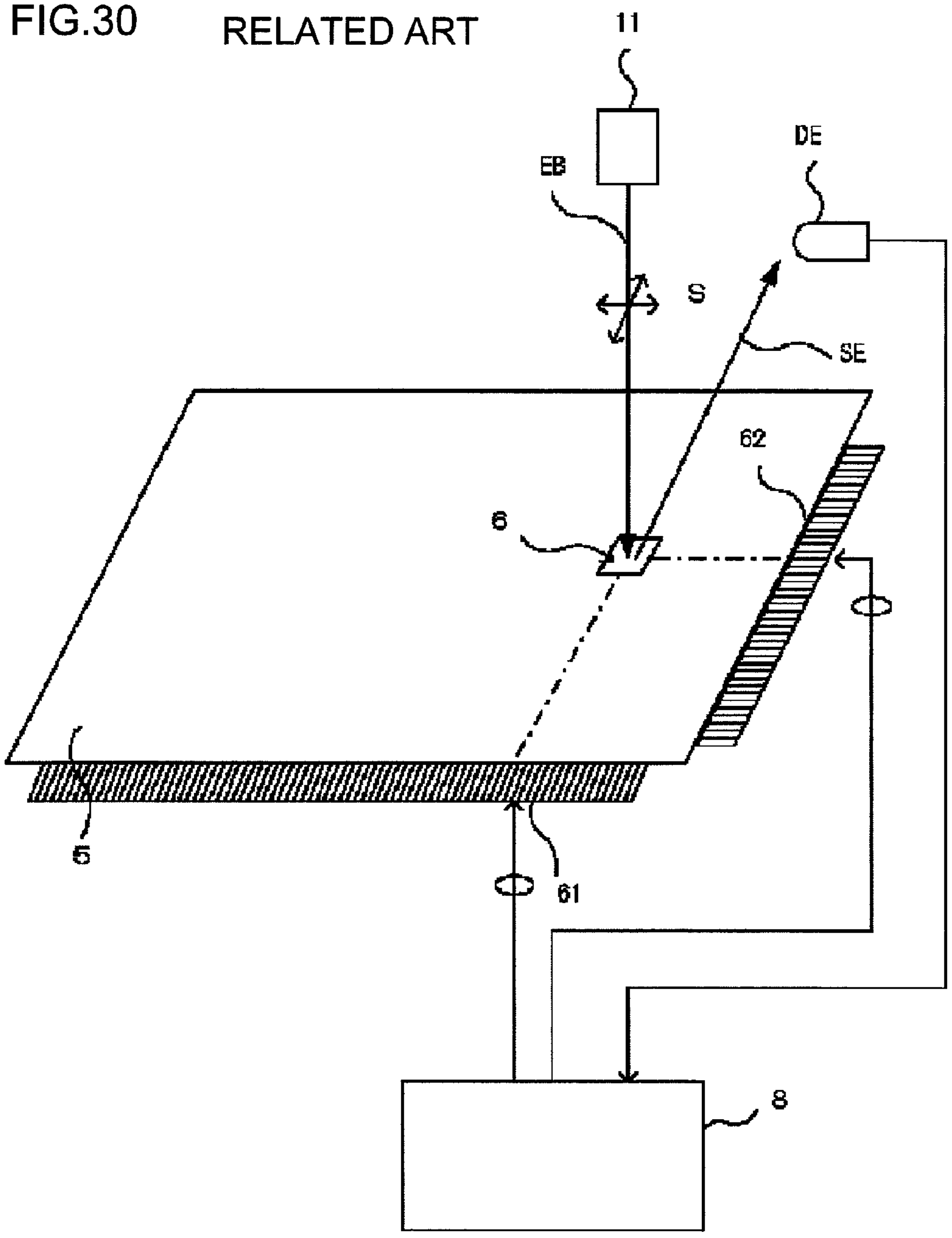
FIG.30 RELATED ART

FIG. 30 is a schematic view showing an example of a typical configuration of a test setup for a TFT array test apparatus.

FIGS. 31A to 31E are schematic views for illustrating the scanning of charged electronic beams and detection of secondary electrons.

Figure 32:
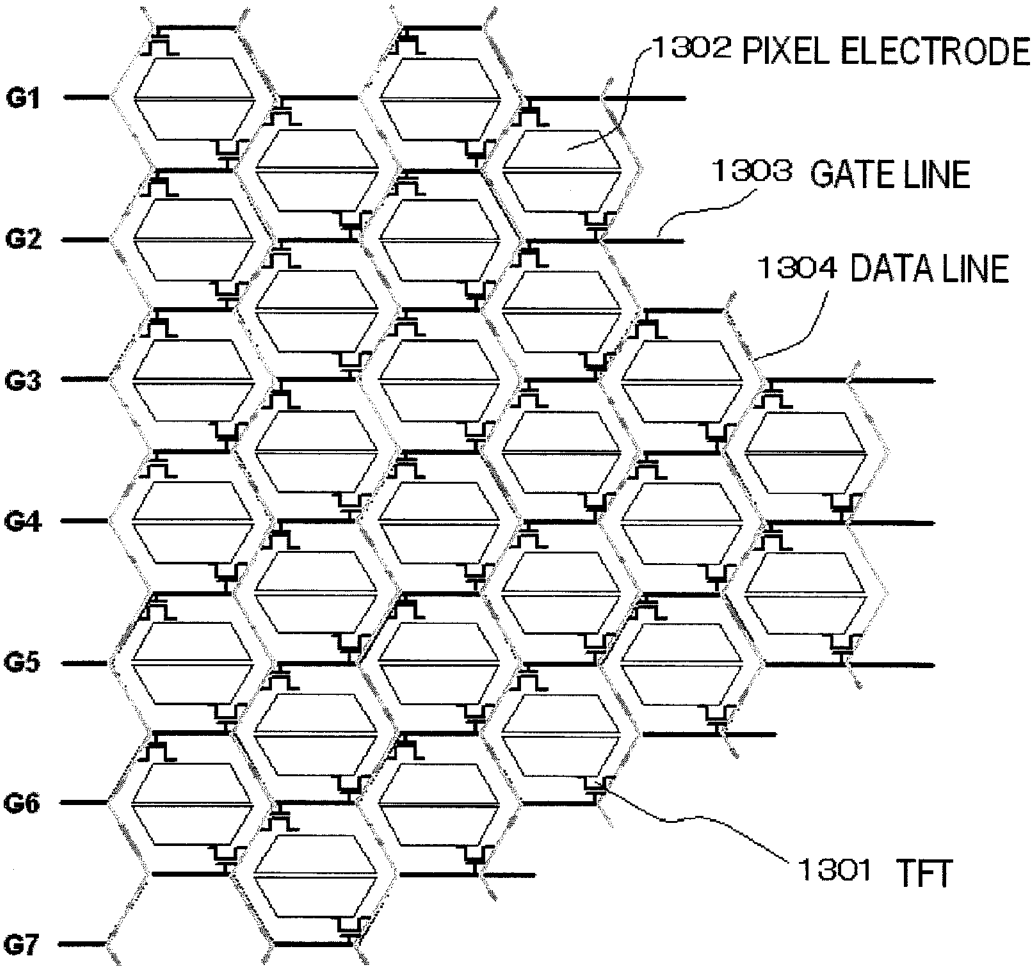

FIG. 32 is a schematic view showing wirings and pixels at an end of the non-rectangular display area used in an Exemplary Embodiment 5' of the present invention.

FIG. 33 is a schematic view showing wirings and pixels at an end of the non-rectangular display area used in an Exemplary Embodiment 9 of the present invention.

FIG. 34 shows a library structure of a GDSII stream as the design information.

Figure 35:
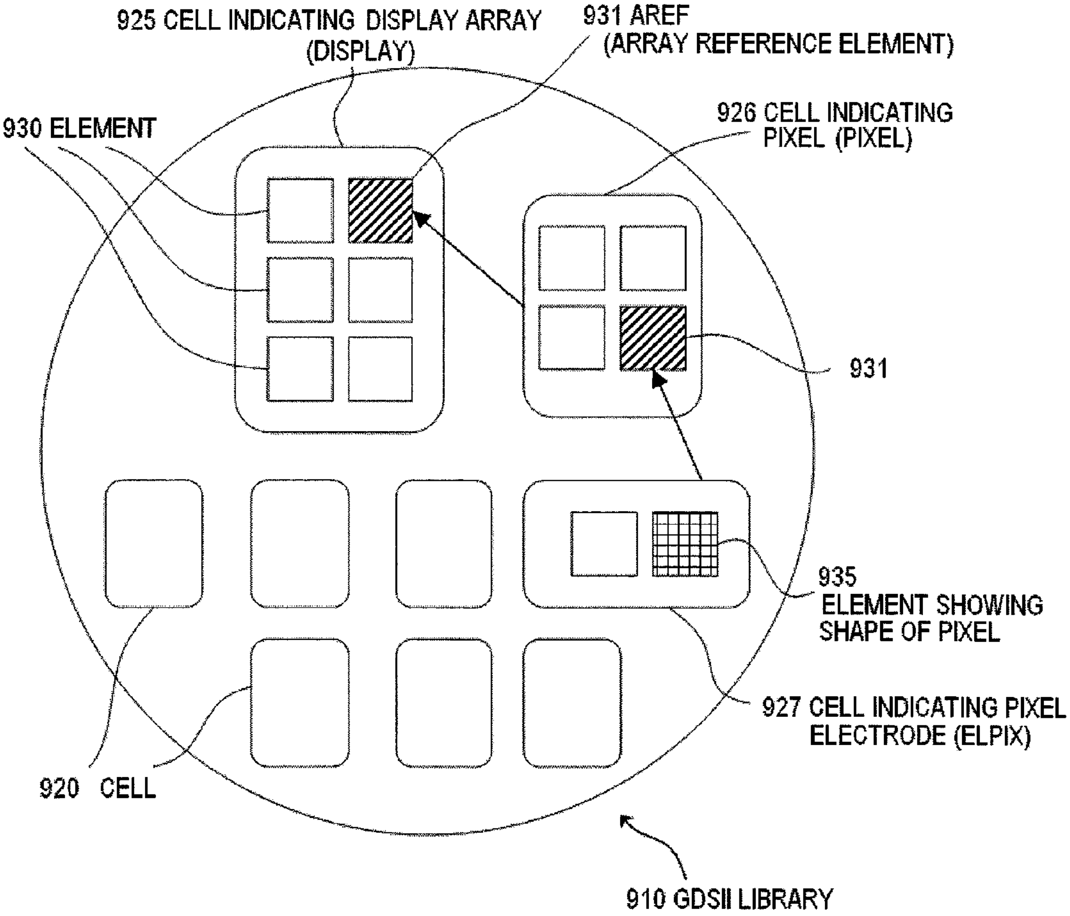

FIG. 35 schematically shows the hierarchical structure and the citation structure of a library of the GDSII stream as the design information.

Figure 36:
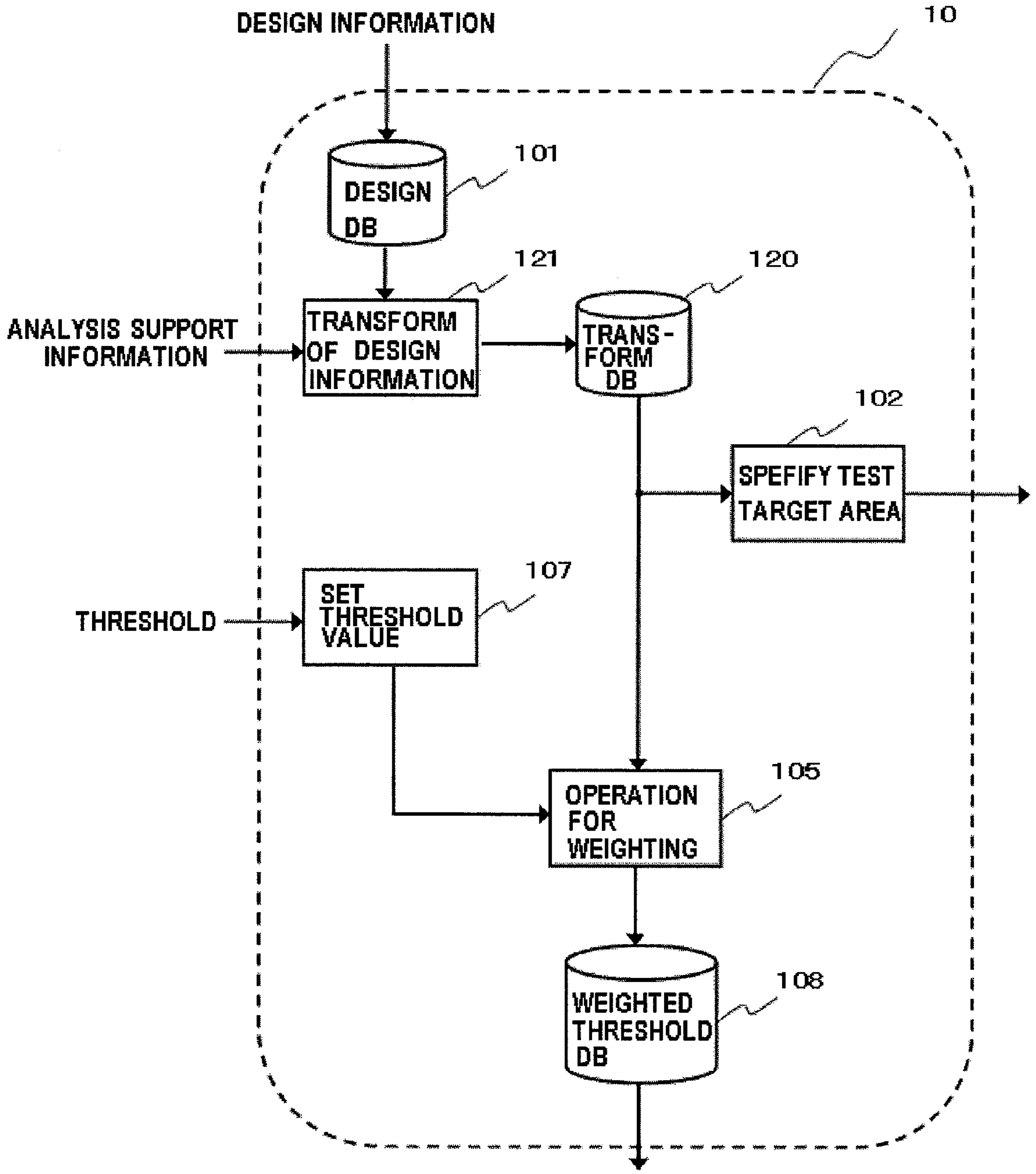

FIG. 36 is a block diagram for illustrating a configuration of an Exemplary Embodiment 11 of the present invention.

Figure 37:
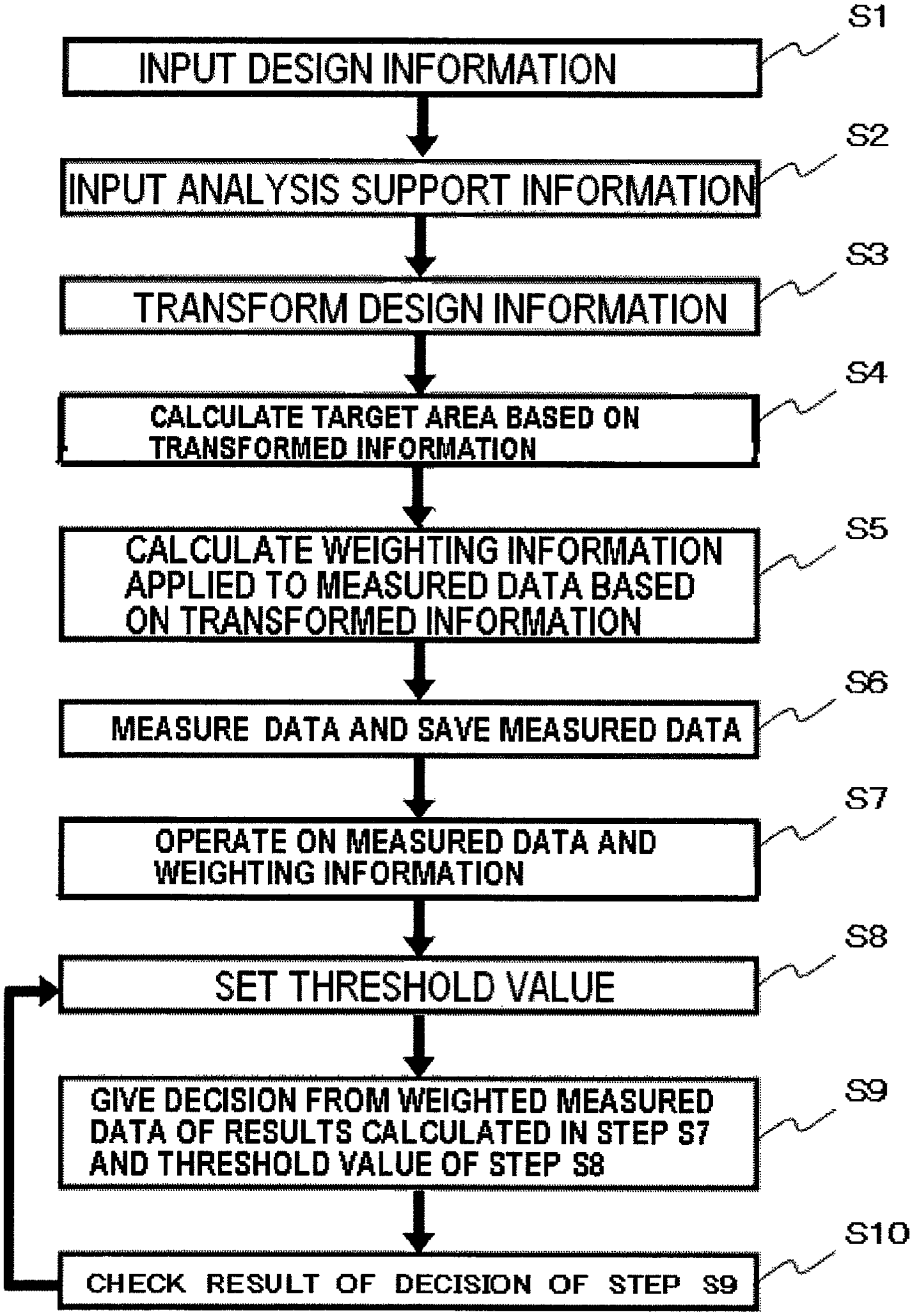

FIG. 37 is a flowchart for illustrating the test procedure on a test apparatus according to the Exemplary Embodiment 11 of the present invention.

PREFERRED MODES

Preferred modes of the present invention will now be described in detail with reference to the drawings. In an aspect of the present invention, a non-rectangular display area under test may efficiently be tested using the design information for the substrate for a display having a non-rectangular display area (array substrate). A smaller capacity of a storage area for saving test data suffices. It is possible to prevent a test electron beam from being irradiated to an area other than the display area to present inconveniences.

In a further aspect of the present invention, the design information contains the layout information of dummy pixels. Dummy pixels are set as a dummy pixel area, using the layout information of the dummy pixels. The dummy pixel area is not made the non-rectangular area for failure testing and is excluded from the test area except for a special purpose that needs, for example, the performance of the dummy pixel itself.

In an aspect of the present invention, the area for analysis of the test results is set using the design information for the array substrate of the display device having a non-rectangular display area. Since the area for analysis is specified using the design information, the test results of the display device having a non-rectangular display area may be analyzed efficiently. Since the design information is used to specify the area for analysis, a smaller capacity of the storage area for analysis data suffices.

In an aspect of the present invention, the manner for scanning a test beam, that is, the scan direction, beam size or the beam shape, is set, again using the information regarding the shape of the display area of the array substrate and the pixel layout information acquired. It is possible to prevent inconveniences otherwise caused by irradiation of a test electron beam to an area other than the display area.

In an aspect of the present invention, the parasitic capacitances by pixels connected to respective wirings or by pixels neighboring thereto may be taken into account in weighting, thereby appreciably reducing the possibility of errors in pass/fail decision in the testing of the display device having a non-rectangular display area. The result is the improved productivity and appreciably lower production costs.

According to the present invention, described above, the testing speed may be improved, while the capacity of the memory for testing may be decreased. In addition, the number of sorts of device parts needed for testing may be reduced, while testing may be improved in ease in operation.

In the outer peripheral part of the display area, the information of the neighboring dummy pixel(s) is also used in generating the weighting information.

In testing the design information of an array substrate of a display device having a non-rectangular display area, in a further exemplary embodiment of the present invention, the design information is transformed into, for example, the following information:

the information on the outer peripheral shape of the non-rectangular display area being tested;

the pixel-based shape information and the connection information, repeated at a specified pitch of repetition;

the direction or the angle of repetition;

an optional point of origin for repetition; and the information regarding the inversion of mirroring with respect to the point of origin.

As mentioned above, the speed up of testing, reduction in capacity of memory for storing test/measurement results, reduction in types of equipments necessary for testing can be achieved. The operation in testing is remarkably improved.

Moreover, according to the present invention, errors in normal/abnormal decision in testing an array substrate of a display device having a non-rectangular display area may be reduced. The number of rejects on re-testing may be reduced to improve the productivity. Defective products may not be allowed to be delivered to downstream side processes to waste resources or consume test time or manufacture time, thereby saving resources and energy and improving productivity.

According to the present invention, the outer peripheral part of the array substrate of the non-rectangular display device may be tested correctly. Testing is feasible even though the shape or size of pixels at the rim part of the display area should differ appreciably, thus improving test performance.

The present invention provides a method and a device for testing that allow for testing even in case the repetitive pattern of sets of pixels should differ from that of the conventional rectangular-shaped display device, and an array substrate as well as a display that uses the method or the device for testing. This should render possible testing of a display device of variable pixel layout patterns as well as test apparatus of a wide range of use.

In the present invention, since the layout information of the dummy pixels is utilized, the dummy pixels can be handled as such, thus allowing excluding the dummy pixels from the objects under test. In the present invention, testing on the outer peripheral part may be more accurate in case the dummy pixel layout information is used to determine the weighting at the outer peripheral part. In addition, according to the present invention, the storage capacity needed in storing the design information may appreciably be diminished, while the test results may be saved with a data structure matched to the pixel structure proper to the display device having a non-rectangular display area. The present invention is now described with reference to Exemplary Embodiments.

Exemplary Embodiment 1

FIG. 1 shows a configuration of a test apparatus of a Exemplary Embodiment 1 of the present invention. Specifically, FIG. 1 shows a configuration of an operation unit 10 and a measurement unit 20 of the test apparatus. The present Exemplary Embodiment uses the design information for a display device having a non-rectangular display area. The operation unit 10 captures the design information for the display device having the non-rectangular display area to store the design information in a design database (design DB) 101.

The operation unit 10 includes a test target area specifying unit 102 and an analysis target area specifying unit 103. The test target area specifying unit 102 and the analysis target area specifying unit 103 specify a test target area and an analysis target area based on the information of the design DB 101.

In the present Exemplary Embodiment, it becomes unnecessary to test an area other than the test target area, because the test target area is specified by the test target area specifying unit 102. Moreover, it becomes unnecessary to analyze an area other than the analysis target area, because the analysis target area is specified by the analysis target area specifying unit 103.

The case where an electron beam is controlled to test a specified test area, as shown in FIG. 1, is now described as an example.

The measurement unit 20 receives data from the operation unit 10 to execute actual measurement to return measured data to the operation unit 10.

The operation unit 10 captures the design information for storage in the design DB 101.

The operation unit 10 specifies the test target area by exploiting the design DB 101.

The information of the test target area, specified by the test target area specifying unit 102, is forwarded to a beam controller 202 and to a stage controller 203 of the measurement unit 20.

The beam controller 202 of the measurement unit 20 controls the scan, beam direction, beam size or the beam shape of an electron beam source 201.

The stage controller 203 of the measurement unit 20 controls mainly the movement along an XY direction of a stage 206 on which a substrate as an object under test is set.

The stage controller 203 also controls the angular direction of rotation within the XY direction (θ-direction), the Z-direction that adjusts the distance between the electron beam source 201 and a stage 206, and the angular direction of adjusting the angle between the electron beam source 201 and the stage 206 (ϕ-direction).

An example of controlling the beam scan direction and the movement along the XY direction is now described with reference to FIGS. 2 and 3.

FIG. 2 is a schematic view for illustrating an example of beam movement in case of testing a non-rectangular display device having a heart-shaped display area using a conventional test apparatus.

FIG. 3 is a schematic view for illustrating an instance of beam movement in case a non-rectangular display device having a heart-shaped display area is tested using a test apparatus of the present Exemplary Embodiment.

In the conventional test apparatus, the beam irradiation start position and the irradiated position of the display area are adjusted in a manner shown in FIG. 2. The beam scans an area broader than the display area. Hence, no pixels exist in an area slightly broader than one third the beam scan area.

As a result, there arise problems (A) to (E), for instance.

(A) The test time is appreciably elongated.

(B) It is necessary to set aside an ample space in which to store detected data.

(C) If an area where pixels exist is to be distinguished from an area where there exist no pixels, there is no alternative but to use a detected signal, such that it is both time- and labor-consuming to detect possible existence or non-existence of pixels.

(D) It is a frequent occurrence that the presence or absence of pixels themselves is taken for the presence or absence of the defects of pixels. Thus, defective pixels may sometimes be verified to exist in an area where there are no pixels, or pixels may sometimes be verified not to exist in an area where there exist defective pixels.

(E) If the circuitry necessary for a display device is provided in an area where no pixels exist and where there is irradiated a beam, there is a possibility that the circuitry is influenced by the beam, for example, such that it undergoes shifting of an operating point due to electrical stress.

Conversely, with the test apparatus of the present Exemplary Embodiment, the beam scans only the display area, as shown in FIG. 3, whereby the problems of the conventional display device may be solved in their entirety.

Moreover, with the conventional test apparatus, the area as a target for analysis is not specified or, if such area is specified, only a rectangular area is specified. Hence, in the test of the display device having a non-rectangular area, the following problems (F) and (G) arise.

(F) The area subjected to data processing as being an area for analysis is a rectangular area. Thus, for a display device having a non-rectangular display area, a rectangular area circumscribing the entire non-rectangular display area is used, or the non-rectangular display area is divided into a plurality of rectangular sub-blocks that together accommodate the non-rectangular display area. It is thus necessary to analyze an area where there exist no pixels, thus increasing the data processing volume to protract the analysis.

(G) There is need to enlarge a storage space for data for analysis and analyzed data, thus increasing the cost.

In the present Exemplary Embodiment, the analysis target area is specified based on the design information. That is, the analysis target area may be made to conform to the non-rectangular display area, thereby decreasing the number of data for analysis and providing for shorter time for analysis. Thus, the memory space for the data for analysis and hence the cost may be reduced.

Exemplary Embodiment 2

FIG. 4 shows a configuration of a test apparatus of an Exemplary Embodiment 2 of the present invention. In the present Exemplary Embodiment, as in the Exemplary Embodiment 1, the design information of the display device having a non-rectangular display area is used. Referring to FIG. 4, a weighting operation unit 105 executes operations for weighting on measured result data, stored in the measured result DB 104, in association with the design information. The operations for weighting use the number of pixels connected to respective wirings of the display device having the non-rectangular display area, as the design information, for instance. The weighting used in the present and following Exemplary Embodiments will now be described using FIGS. 5 to 7.

FIGS. 5 and 6 schematically show parasitic capacitances on wirings and pixel electrodes associated with the wirings in terms of resistance and capacitance.

In FIGS. 5 and 6, resistance $R_{fix}$ and capacitance $C_{fix}$ denote resistance and capacitance present common to all wirings irrespective of the number of the pixels connected thereto. In many cases, these resistances and capacitances may not be of the identical values because of different routing lengths of wirings down to the pixels. However, it is here presumed that the resistances and capacitances are of the same value for the total of the wirings, and that a signal is delivered from one end of the resistance $R_{fix}$. It is also postulated for simplicity that the pixels connected are of the same size and shape and are arrayed at a constant pitch. The resistance for a length of the signal line corresponding to the pixel pitch is denoted as $R_{par}$, and the capacitance proper to the pixel associated with the signal line length is denoted as $C_{par}$.

Six pixels are connected to the wiring of FIG. 5, and three pixels are connected to a wiring of FIG. 6. By simple calculations, the resistance and the capacitance of the wiring of FIG. 5 are $R_{fix}+6xR_{par}$ and $C_{fix}+6xC_{par}$, respectively, while those of the wiring of FIG. 6 are $R_{fix}+3xR_{par}$ and $C_{fix}+3xC_{par}$, respectively.

In the following, delay in an input signal at a node E1 of FIG. 5 (terminal voltage of the parasitic capacitance of the sixth pixel) and that at a node E2 of FIG. 6 (terminal voltage of the parasitic capacitance of the third pixel) are checked.

Ordinarily, the signal delay is expressed as a product of the resistance and capacitance. For example, in FIG. 5, the signal delay is expressed by $$(R_{fix}+6xR_{par})\times(C_{fix}+6xC_{par}).$$

In general, for the number n of the pixels connected, the signal delay is expressed as follows:

$$(R_{fix}+nxR_{par})\times(C_{fix}+nxC_{par}).$$

However, if, in the case of a circuit composed of a plurality of resistors and capacitors, as shown in FIGS. 5 and 6, the delay of an input signal is to be handled correctly, the circuit needs to be considered to be a distributed constant circuit.

That is, the circuit needs to be treated as a transmission line, using distributed resistances ($R_{par}$) and distributed capacitances ($C_{par}$) shown in FIGS. 5 and 6.

If the circuit is treated as a distributed constant circuit, in connection with the number of pixels, an approximate signal delay is given as follows:

$$\frac{1}{2}\cdot n\cdot(n+1)\cdot R_{par}\cdot C_{par} \tag{1}$$

where n denotes the number of pixels.

This signal delay is approximately one-half of that obtained by simple calculations of the total of the resistances and capacitances.

With the present Exemplary Embodiment, the operations for weighting are carried out, as the signal delay related with the lengths of wirings and the numbers of pixels of respective wirings of the display device having a non-rectangular display area are taken into account, using the expression (1), for instance.

Meanwhile, in FIGS. 5 and 6, the parasitic capacitance is assumed to be constant for the pixel pitch for simplicity. However, in a display device having a non-rectangular display area, it may sometimes occur that this parasitic capacitance is not constant, as now described in FIG. 7.

FIG. 7 shows an end part of the display area, specifically wirings and pixels, to an enlarged scale. In FIG. 7, the pixels are arrayed to form a square array at a constant pitch in both the vertical and horizontal directions. Storage capacitor electrodes and storage capacitor electrode lines are omitted from the drawing.

Referring to FIG. 7, each pixel is provided at an intersection of a gate line 703 and a data line 704, and includes a thin-film transistor (TFT) 701 and a pixel electrode 702. The TFT 701 has a gate connected to a gate line 703, while having one of a drain and a source connected to a data line 704 and having the other of the drain and the source connected to a pixel electrode 702. In FIG. 7, the gate lines are numbered from G1 to G7. The symbols P24, P43 and P55 are used to depict pixel electrodes. Specifically, P24 denotes a pixel electrode at an intersection of a second gate line G2 and a fourth data line.

If attention is directed to the gate line G4, there are six pixel electrodes connected to the TFT, the gate of which is connected to the underside of the gate line G4, in FIG. 7. On the upper side of the gate line G4, there are six pixel electrodes of pixels connected to the gate line G3 via TFTs.

As a result, there are at least capacitances of six TFTs, the gates of which are connected to the gate line G4, capacitances of six pixel electrodes connected to the six TFTs, and capacitances of six pixel electrodes connected to the gate line G3, as parasitic capacitances of the gate line G4.

If the wiring is subdivided, every pixel pitch, there are a capacitance $C_{tft}$ for each TFT, a capacitance $C_{gp1}$ of a pixel electrode connected to the TFT, and a capacitance $C_{gp2}$ of a pixel electrode connected to a gate line which is an upper side neighbor of the gate line the TFT is connected to.

That is, the parasitic capacitance $C_{par}$ per pixel length may be expressed by the following equation (2):

$$C_{par}=C_{tft}+C_{gp1}+C_{gp2} \quad (2)$$

If attention is directed to the gate line G3, there are six TFTs and six pixel electrodes on the underside of the gate line G3, and four pixel electrodes, connected to the gate line G2, on the upper side of the gate line G3. In this case, the parasitic capacitance $C_{par}$ of the four left-side pixels, out of the six pixels connected to the gate line G3, is as expressed by the equation (2). However, the parasitic capacitance $C_{par}$ of the two right-side pixels is $$C_{par}=C_{tft}+C_{gp1} \quad (3)$$

because there are no pixel electrodes connected to the gate line G2.

If attention is directed to the gate line G6, there are three TFTs and three pixel electrodes on the underside of the gate line G6, while there are five pixel electrodes connected via TFTs to the gate line G5 on the upper side of the gate line G6. In this case, the parasitic capacitance $C_{par}$ of three left-side pixels of the gate line G6 is expressed by the equation (2), while the parasitic capacitance $C_{par}$ of two right side pixels of the gate line G6 (two right-side pixels out of five pixels of the neighboring gate line G5) is $$C_{par}=C_{tft}+C_{gp2} \quad (4).$$

That is, there are at least three sorts of capacitances, expressed by the equations (2) to (4), as parasitic capacitance $C_{par}$ per unit pixel length.

In the present Exemplary Embodiment, the operations for weighting are carried out as this point is taken into account. The difference in resistance or parasitic capacitance, due to the lengths of respective wirings, may be expressed by the number of pixels connected to each wiring and a neighboring wiring. This enables wiring delay, prescribed by the resistance and capacitance, to be estimated from the design information. By weighting based on the estimated delay information, it is possible to conduct testing from which the influence of delay caused in each wiring has been excluded. As a result, it becomes possible to exclude the influence of the difference in delay in respective wirings ascribable to the non-rectangular display area.

Only the parasitic capacitance relating to the gate line has been shown above. The operations for weighting for the data line may be carried out in a similar manner as well.

Similar processing may be carried out for all of the gate lines, data lines and storage capacitor lines to further eliminate the influence of difference in delay in each wiring ascribable to the non-rectangular display area.

In FIG. 4, the information of the test area specified by the test target area specifying unit 102 of the operation unit 10 is delivered to the measurement unit 20.

The measured results by the measurement unit 20 are forwarded to the operation unit 10 so as to be used for operations for weighting. The results of the operations for weighting are supplied to an analysis unit not shown, in order to give a pass/fail decision.

Exemplary Embodiment 3

An Exemplary Embodiment 3 of the present invention is now described. In the Exemplary Embodiment 3 of the present invention, the operations for weighting are carried out, using the design information, as in the Exemplary Embodiment 2. With the present Exemplary Embodiment, the number as well as the locations of pixels around each pixel of a display device having the non-rectangular display area is used as the design information for the operations for weighting.

Initially, the basic information regarding the layout of pixel electrodes is schematically described with reference to FIGS. 8 to 11.

FIG. 8 shows the layout of the wirings and a pixel electrode 802 in a substrate for a typical display. Switching elements, such as TFTs, are now shown for simplicity. The pixels are arrayed in a square at the same pitch for both the vertical and horizontal directions. Referring to FIG. 8, each pixel is made up of a gate line 801, a data line 803 and a pixel electrode 802.

FIG. 9 shows a schematic cross-sectional view taken along line A-A' of FIG. 8. Referring to FIG. 9, the cross-section of the substrate of a display device includes a glass substrate 804 and an insulating film 805 formed thereon. A gate line 801 is formed thereon, and is covered by an insulating film 806. A pixel electrode 802 is arranged at a position not overlapping with the gate line in the vertical direction.

In the configuration, shown in FIGS. 8 and 9, the electrical lines of force in an electrical field from the pixel electrode 802 proceed substantially in their entirety to the gate line 801 and a counter-electrode, not shown. Consequently, the parasitic capacitance is scarcely generated between the pixel electrodes 802.

FIG. 10 depicts the layout of the wirings and pixel electrodes 1002 in a substrate of a display device slightly different in configuration from that shown in FIG. 8. In FIG. 10, the line width of each wiring is thinner than in FIG. 8. Moreover, the pixel electrode 1002 is slightly larger in size and is partially overlapped with the respective wirings (a gate line 1001 or a data line 1003).

FIG. 11 schematically shows the cross-section taken along line B-B' of FIG. 10. The configuration of FIG. 11 significantly differs from that of FIG. 9 in that an insulating film 1006 on the gate line 1001 is thicker in the configuration of FIG. 11. By this configuration, the parasitic capacitance between the gate line 1001 and the pixel electrode 1002 is decreased to render it possible to stack the gate line 1001 and the pixel electrode 1002 in the vertical direction.

In the configuration of FIGS. 10 and 11, the electric field from the pixel electrode 1002 proceed not only to the gate line 1001 and the counter-electrode, not shown, but through a space between the pixel electrodes 1002. This produces parasitic capacitance between the pixel electrodes 1002. Thus, with a configuration having high parasitic capacitance between the pixel electrodes, neighboring pixels significantly influence the characteristic of the pixel under test.

In the present Exemplary Embodiment, the information regarding the neighboring pixels is utilized for weighting to moderate the influence of the neighboring pixels. In the present Exemplary Embodiment, even the information as to whether or not there exist neighboring pixels may be used for operations for weighting, as in the Exemplary Embodiment 2 directed to the wirings. In the case of the present Exemplary Embodiment, simply the number of the neighboring pixels is used for weighting.

Exemplary Embodiment 4

An Exemplary Embodiment 4 of the present invention is now described. In the present Exemplary Embodiment, the operations for weighting are carried out using the design information, as in the Exemplary Embodiments 2 and 3 described above. However, in the present Exemplary Embodiment, it is not the measured results but rather a threshold value that is the subject of the operations for weighting. The threshold value is used to verify the pass/fail of the measured results.

FIG. 12 shows the configuration of an operation unit 10 in a test apparatus of an Exemplary Embodiment 4 of the present invention. Referring to FIG. 12, the design DB 101 of the operation unit 10 inputs the design information. The input design information is used in the test target area specifying unit 102 for specifying the test target area.

A threshold value, a reference value used in verifying pass/fail of the results of test is entered from outside to a threshold value setting unit 107.

The weighting operation unit 105 executes calculations for weighting the threshold value with the design information. The so weighted threshold value is saved in a weighted threshold value DB 108.

The weighted threshold values need to be generated for the total of the regions of the target for test and for the total of the conditions for decision, thus increasing the data volume. It is however unnecessary to execute the weighting operations, such as those performed with the above Exemplary Embodiment, from time to time in the course of verifying the actual results of test.

That is, a pass/fail decision may be given by simply comparing the threshold value, obtained beforehand by the operations for weighting, and the data indicating the results of test.

This advance processing for weighting may be carried out as soon after supply of the design information as possible.

The operations for weighting may also be carried out for each point of measurement at the same time as measurement at each measurement point in the course of test. It is then unnecessary to carry out the operations for weighting, thus enabling quick decision on pass/fail.

The threshold value is such a value of comparison higher or lower than which indicates pass or fail. Or, the threshold value of comparison lying within a certain extent on both sides of and including a mid value may indicate pass or fail.

Exemplary Embodiment 5

An Exemplary Embodiment 5 of the present invention is now described. In this Exemplary Embodiment 5, the present invention is applied to a display device having a non-rectangular display area in which pixels at the outer peripheral (circumferential) part is varied in area, shape or size.

In FIG. 7, the total of the pixels are square-shaped. However, a display with a non-rectangular display area may have a pixel shape, shown in FIG. 13, to improve the appearance at the peripheral part of the display area.

FIG. 13 depicts a partial enlarged view of the display area in which a peripheral part of the display area is shown to an enlarged scale. In particular, there are pixels on the peripheral part of the display area that have non-square shapes. Comparison of FIG. 13 to FIG. 7 indicates that, in FIG. 13, the outer peripheral part of the display area has a smoothly changing profile. With these pixels, the foregoing consideration is valid if the parasitic capacitance at the outer peripheral part is changed.

Moreover, the pixels at the outer peripheral part, such as P24 or P55, are tested as the reduced sizes or the deformed shapes of the pixels are taken into account as the design information. That is, not only the test area is specified, but the areas as well as the shapes of the pixels at the outer peripheral part are taken into account to illuminate an electron beam for test.

FIG. 14 shows, for the pixel configuration of FIG. 13, an instance of arraying the spots of the electron beam irradiated for test. FIG. 14 shows the same arraying of the pixels as that of FIG. 13. For simplicity, the wirings or TFTs are not shown.

Referring to FIG. 14, four beam spots are arrayed substantially evenly for the pixel P43, for instance.

With the pixel P24, upper two spots are shifted towards left.

With the pixel P55, the total of the four spots are arrayed on a line.

By this arraying of the beam spots, four beam spots may be arrayed in all of the pixels.

Moreover, all beam spots may be arrayed on the scan lines.

With the above-described configuration, a display device having a non-rectangular but smooth display area may be tested satisfactorily.

In the present Exemplary Embodiment, the beam spots of the total of the pixels are arrayed on the same scan lines. However, if this arraying is not possible, depending on the particular shape of the pixel, one other scan line may be set.

In the above explanation, the number of beams irradiating each pixel is assumed to be equal from one pixel to another. However, if, due to the shape of the pixels, the number of the beams per pixel cannot be made equal, the number of the beam spots may be changed depending on particular pixels. In such case, the information about the differing numbers of the beam spots may be held with the design information so as to be taken into account in subsequently pass/failure decisions.

By exploiting the design information in this manner, measurement and data processing may be carried out more flexibly to conform to the non-rectangular display area.

Exemplary Embodiment 5

An Exemplary Embodiment 5' of the present invention will now be described. In the Exemplary Embodiment 5', the present invention is applied to such a display where the pixels are not square or rectangular but are non-rectangular in shape.

Like FIG. 7, FIG. 32 is an enlarged plan view showing an end part of the display area. In FIG. 32, there are shown wirings and pixels, with each pixel having a trapezoidal-shape. Two trapezoidally-shaped pixels 1302 are combined together, with the long sides of the trapezoid facing each other with a small gap in-between, such as to form a substantially hexagonally-shaped pixel pair. A gate line 1303 and a data line 1404 are not straight lines, but are made to conform to the sides of the hexagonally-shaped pixel pair. In the Exemplary Embodiment of FIG. 32, the gate line 1303 is laid in a space between neighboring short sides of the trapezoids of the pixels for extending parallel to the short sides, and is connected to the gate electrodes of TFTs 1301 at the corners or in the vicinity of the corners of the short sides. A data line 1304 is laid, as it is bent in a zigzag pattern for extending along oblique sides of the trapezoids in a space defined between the neighboring pixel pairs. The data line is then connected to a first diffusion layer (source or drain) of the TFT at the corner of the short side of the trapezoid. A second diffusion layer (drain or source) of the TFT is connected to a pixel electrode 1302 of the trapezoid.

With the configuration of FIG. 32, compared to that of FIG. 7, the outer shape of the display area shows smooth transition. The above consideration may apply to such pixel configuration by changing the value of the parasitic capacitances at the outer peripheral part. That is, with the complex shape of the pixels that compose a pixel array, in which two trapezoidally-shaped pixels are combined together to form a hexagonally-shaped pixel pair, and a large number of these hexagonally-shaped pixel pairs make up a pixel array, testing may be performed satisfactorily because the design information of the pixel array may be used for testing. The outer peripheral part of the pixel array may also be tested satisfactorily because the design information of the non-rectangular outer peripheral part of the pixel array is similarly used for testing.

Exemplary Embodiment 6

An Exemplary Embodiment 6 of the present invention is now described. In the following, test for such a case in which, in a display device having a non-rectangular display area, the pixel shape is neither a square nor a rectangle, and a plurality of sets of pixels are not arrayed on perpendicular axes, is described by way of an Exemplary Embodiment 6.

Referring to FIG. 15, the Exemplary Embodiment 6 will be described. FIG. 15 shows the outer peripheral part of a non-rectangular display area of the non-rectangular display, to an enlarged scale. In FIG. 15, no wirings, no TFTs nor pixel electrodes are shown, while areas taken up by pixels only are shown with broken lines. In FIG. 15, the pixels 1503 are non-rectangular and, more specifically, triangular in shape. A number of pixels 1503 are collected together to form a set of pixels 1504 which is to be one of elements that make up a repetitive pattern.

Referring to FIG. 15, each pixel of the set of pixels 1504 is made up of two triangular pixels 1503 juxtaposed to each other. In the vicinity of a contour 1501 of the display area, there is a pixel 1505 isolated from the set of pixels 1504. Such pixel 1505 renders the outer rim of the display area smooth. The pixel 1503 is not a rectangular triangle and has the internal angle which is largest among its three internal angles is 85°.

In such arrangement, a plurality of the sets of pixels 1504 are arrayed for extending along two axes that form an angle of 85°. Moreover, the sets of pixels 1504 are angled with respect to the horizontal and vertical axes.

It is observed that electron beam spots 1502 when irradiating an electron beam for test may be arrayed relative to the arrangement of FIG. 15, as shown in FIG. 16. The scan direction of the electron beam is neither vertical nor horizontal, but is angled.

That is, with the present Exemplary Embodiment, the area of test is determined based on the design information, and hence the scan direction including the angle of the test beam can be determined in response to the arrangement of pixels under test. Additionally, the entirety of the beam spots 1502 are set so as to pass through the center of gravity of each pixel 1503.

The conventional test apparatus is able to cope with only the horizontal and vertical directions and hence is not able to cope with the pixel arrangement shown in FIG. 15.

In addition, it may sometimes occur that the beam is irradiated on a position different from the center of gravity of each pixel, or on differing positions of pixels from pixel to pixel. There may also be cases where the beam is irradiated on only a part of the pixel electrode. The result is low reliability of measured results.

Exemplary Embodiment 7

An Exemplary Embodiment 7 of the present invention is now described. As the Exemplary Embodiment 7 of the present invention, an instance of a test apparatus for testing a display device having a non-rectangular display area is shown. In the present Exemplary Embodiment, the methods of testing of an Exemplary Embodiments 1 and 2 are applied. FIG. 17 depicts a flowchart for illustrating the operation of the test method of the present Exemplary Embodiment.

The design information is inputted (step 1).

Based on the design information, inputted in the step 1, an area of the target for test is set (step 2). This setting may be made manually as a picture image displaying the design information is viewed. Or, it may be made automatically as the design information is analyzed automatically. It may also be made by manual setting and automatic setting in combination.

Based on the design information, inputted in step S1, the weighting information, applied to measured data, is calculated (step 3).

Measurement is then made and measured data as measured results are saved (step 4). The sequence of the steps 3 and 4 may be reversed, or the steps may be carried out in parallel.

Weighted measured data are generated (step S5) by operations on the weighting information obtained in the step S3 and on measured data obtained and saved in the step S4.

A threshold value used for giving a pass/fail decision is set (step S6). Meanwhile, this step S6 may be carried out before any one of the steps S1 to S5. However, the step S6 is carried out here because it is presupposed to adjust the threshold value.

Weighted measured data obtained by the step S5 is compared to the threshold value as set in the step S6 to give a pass/fail decision (step S7).

It is then verified in a step S8 whether or not there has been made any decision error in the result of decision in the step S7.

If it has been confirmed that an error has occurred in the decision of the step S8, and such decision error may possibly be eliminated by changing the setting of the threshold value, the program flow reverts to the step S6 to change the setting of the threshold value.

In giving the decision of the step S8, several methods may be used, as indicated below.

For example, such a method may be used in which data obtained is compared to data obtained beforehand by other test methods.

Such a method may also be used in which measurement is repeated a number of times to compare the differences between measurement events. In particular, the occurrences of decision errors may be recognized more readily by carrying out measurements a number of times with variable beam angles, variable beam spot size or the variable number of beam spots.

By using a method of comparing the measured results with the results of pass/fail distribution of past samples, manufactured under the same design conditions or under the prototype manufacturing conditions, and by applying the tendency of the pass/fail distribution under the prototype manufacturing conditions, it is possible to confirm the occurrence of decision errors.

FIG. 18 shows a configuration of a test apparatus that performs the sequence explained with reference to FIG. 17.

Referring to FIG. 17, the operation unit 10 captures the design information into the design DB 101 (step S1 of FIG. 17).

The test target area specifying unit 102 of the operation unit 10 specifies a test target area from the design DB 101 (step S2 of FIG. 17).

The weighting information 1 (109) is generated through processing in the design DB 101 and in the weighting operation unit 105 (step S3 of FIG. 17).

Based on the so specified test target area, the measurement unit 20 exercises beam control of controlling the electron beam source 201 as well as stage control of controlling a stage 206 on which to set a sample.

A secondary electron beam, irradiated on the sample, is detected by a detector (DE) 205. A detection controller 204 controls the detection by the detector (DE) 205.

Data of test results from the detection controller 204 are forwarded to the measured result DB 104 of the measurement unit 20. This completes measurement of the step S4 of FIG. 17 and saving of the measured data.

The operation unit 10 executes calculations, using the measured result DB 104 and the database of the weighting information 1 (109) to generate a weighted result DB 106 (step S5 of FIG. 17). The so generated data is forwarded to an analysis unit (142 of FIG. 21) as later described to perform the processing of steps S6 to S8.

With the present Exemplary Embodiment, the substrate of a display device having a non-rectangular display area may be tested satisfactorily.

FIG. 21 shows schematics of a configuration of a test apparatus used in the present Exemplary Embodiment. The test apparatus includes a vacuum controller 153, a sensor 154, a loader/unloader 156, as necessary, a power supply 155 and a controller 150, for example. The test apparatus also includes a memory 151, an operation unit 10, a measurement unit 20, an analysis unit 142 and an input/output unit 152. The test apparatus further includes a network connection means, not shown, if necessary.

The input/output unit 152 inputs the design information from outside. The design information and a variety of weighted data are stored in the memory 151 as necessary.

The operation unit 10 executes the processing for operations, such as operations for weighting.

The measurement unit 20 controls the area for measurement or the beam direction, for example, based on the design information.

The analysis unit 142 analyzes measured results with the aid of the design information, measured data and a variety of weighted data.

Exemplary Embodiment 8

An Exemplary Embodiment 8 of the present invention is now described with reference to FIGS. 19 and 20. The following shows another instance of a test apparatus that tests a display device having a non-rectangular display area. The configuration of the test apparatus of the present Exemplary Embodiment is shown in its entirety in FIG. 21, similarly to the above-described Exemplary Embodiment 7.

FIG. 19 depicts a flowchart showing the sequence of the test method of an Exemplary Embodiment 8 of the present invention. In the present Exemplary Embodiment, the Exemplary Embodiments 1 and 4, described above, are applied. That is, testing is carried out in the following sequence, as shown in FIG. 19. The steps S1, S2, S4 and S8 are the same as the corresponding steps of FIG. 17.

In a step S3A, the weighting information, applied to the threshold value, specified by default, is calculated based on the design information as inputted in the step S1. The sequence of the steps S3A and S4 may be reversed or may be carried out in parallel.

In a step S5A, a threshold value for decision is set. If no change is made from the default value, this step is skipped.

The weighting information of the step S3A and the threshold value as set in the step S5A are calculated to generate the weighted threshold value information (step S6A). It is observed that, if the step S5A is skipped, the default threshold value is used.

In a step S7A, measured data of the step S4 and the weighted threshold value, calculated in the step S6A are compared to each other to verify pass/fail.

In a step S8, it is decided whether or not there is any decision error in the results on pass/fail. Should there be any decision error, the program flow reverts to the step S5A to re-set the threshold value.

FIG. 20 shows the configuration of the operation unit 10 and the measurement unit 20 of the test apparatus that performs the sequence of FIG. 19.

Referring to FIG. 20, the design information is stored in the design DB 101 of the operation unit 10 (step S1 of FIG. 19). The test target area is specified from the design DB 101 (step S2).

A database of the weighting information 2 (111) is generated by operations by the weighting operation unit 105 from the design DB 101 (step S3A).

Referring to FIG. 20, measurement is carried out for the specified test target area, as the electron beam source 201 is controlled by way of beam control and as the stage 206 on which to set a sample is controlled by way of stage control, by the measurement unit 20. Secondary electrons by the electron beam, irradiated on the sample, are detected by the detector (DE) 205, under control by detection control. Data of test results from detection control is forwarded to the measured result DB 104 of the operation unit 10. This completes measurement and storage of the measured data (S4 of FIG. 19).

In the present Exemplary Embodiment, the measured result DB 104 and the weighting information 2 (111) are forwarded to the analysis unit 142 of FIG. 21 where the processing of steps S5A to S8 is carried out.

That is, the setting of the threshold value by the step S5A of FIG. 19 is by the analysis unit 142. It should be noted that the present invention is not limited to this configuration and the threshold value setting may also be carried out by the operation unit 10, as necessary, as shown in FIG. 12.

With the test apparatus of the present Exemplary Embodiment, the substrate of a display device having a non-rectangular display area may be tested satisfactorily.

Exemplary Embodiment 9

An Exemplary Embodiment 9 of the present invention will now be described. FIG. 33 is a schematic view showing the Exemplary Embodiment 9 of the present invention. In the following, an example test in which a plurality of dummy pixels, not contributing to display, are arranged in the vicinity of the outer rim of a display area, is shown by way of the Exemplary Embodiment 9. In FIG. 33, the wirings and the pixels at an end part of the display area are shown to an enlarged scale. In FIG. 33, there is shown a pixel array corresponding to the pixel array of FIG. 7 to which are added the dummy pixels 750.

How many dummy pixels are to be provided on the outer peripheral part is arbitrary. In the Exemplary Embodiment shown in FIG. 33, a single dummy pixel 750 is assumed to exist on the outer peripheral part for simplicity. In the present Exemplary Embodiment, the transistor (TFT) 701 is not provided for the dummy pixel. Moreover, the dummy pixel is in a floating state.

In the present Exemplary Embodiment, the information on the dummy pixel is afforded beforehand as the design information. Hence, the dummy pixel area may be excluded from the test object area of the step S2 in the test technique of FIG. 17. As a result, testing may be improved in efficiency. In particular, since there is no risk of mistaken detection of abnormal pixels by the dummy pixels, it is possible to improve test accuracy as well as test efficiency.

Exemplary Embodiment 10

An Exemplary Embodiment 10 of the present invention will now be described. With the present Exemplary Embodiment, an example weighting for testing in case a dummy pixel not contributing to display is arranged on the outer peripheral part of a display area is shown. The sequence of weighting is similar to that described in connection with Exemplary Embodiment 2.

Referring to FIG. 4, to which reference has been made in the above explanation of the Exemplary Embodiment 2, a weighting unit 105 performs operations on data of measured results based on the design information. The measured results are assumed to be saved in a measured result DB 104. This Exemplary Embodiment is now described with reference to FIG. 33 referred to in the above description of an Exemplary Embodiment 9.

If attention is directed to the gate line G4 in FIG. 33, there are six pixel electrodes, such as P43, connected to TFTs, the gates of which are connected to the gate line G4, on the underside of the gate line G4 for facing the gate line G5. There is also a single dummy pixel electrode not provided with the TFT and which is not connected to the gate line. There are also six pixel electrodes on the upper side of the gate line G4 for directing to the gate line G3. These six pixel electrodes are connected to the gate line G3 via the TFTs. There is also a dummy pixel electrode not provided with the TFT and which is not connected to the gate line. As a result, there are at least the capacitances of six TFTs, the gates of which are connected to the gate line G4;

the capacitances of the six pixel electrodes, connected to the six TFTs;

the capacitance of the single dummy pixel electrode, not connected to the gate line G4;

the capacitances of six pixel electrodes, connected to the gate line G3; and the capacitance of the single dummy pixel electrode, not connected to the gate line G3 as the parasitic capacitance of the gate line G4.

The capacitances and resistances, which are the same as those considered in the above Exemplary Embodiment 2, may be found as the dummy pixel electrodes are also taken into account.

In the present Exemplary Embodiment, the dummy pixel is also taken into account in doing weighting operations, thus in a manner different from the case of the operations for weighting of the Exemplary Embodiment 2 described above. As a result, it is possible to eliminate the influence from the dummy pixel.

Exemplary Embodiment 1

An Exemplary Embodiment 11 of the present invention will now be described. In the present Exemplary Embodiment, in testing a substrate for a display device having a non-rectangular display area, the design information is transformed into a more efficient form.

The format of the design information, now used most extensively, is the GDSII stream (GDSII format). It is because the GDSII stream format has now become the de fact standard for the description of a semiconductor mask pattern. It is convenient that the design information of the substrate for a display itself, which is most often manufactured by using a mask, is also of the same format as the design information of the mask. For this reason, the GDSII stream is widely used.

Hence, the design information of the GDSII stream is shown here as an example. The present invention may however apply for the design information of the format other than this example.

The entire data of the GDSII stream is of the structure shown in FIG. 34, and is termed a ‘library structure’. Meanwhile, in FIG. 34, data not directly relevant to the subject-matter of the invention is dispensed with.

The stream begins with VERSION, representing a version name, followed by BGNLB to state library data. The stream ends with ENLIB. The library data is composed of a header part, made up of LIBNAME, indicating the library name, and UNITS, indicating units, and a set of a large number of cells, each of which is the content of actual data. That is, of the library structure, the part that indicates the shape or the layout is the set of cells.

The library structure has a complex hierarchical structure and a citation structure. FIG. 35 conceptually shows a library structure and, more specifically, the structure of a GDSII stream. That is, FIG. 35 conceptually shows what hierarchical structure is the GDSII library 910 and what is its citation relationship.

In FIG. 35, a cell 920 is comprised of its cell name and an array of a large number of structural components, termed elements 930, such as graphical figures. The elements 930 include a PATH indicating an interconnect not having a width, a BOUNDARY indicating a polygon, colored all-over, a TEXT, indicating a text, a BOX, indicating a rectangle, as constituents of a figure, a NODE, indicating a node for electrical connection, and several elements used when citing other cells. It is observed that the width of PATH is specified by the statement WIDTH in the element.

Among the elements, citing other cells, there is an element termed AREF (array reference element) 931 that cites an XY array which is an XY matrix of larger numbers of cells. In a conventional commonplace substrate for a display device, a pixel array is constituted by referring to a pixel based cell 926, provisionally termed ‘PIXEL’, by AREF from a given cell 925, provisionally termed ‘DISPLAY’.

That is, among the elements of the cell structure of DISPLAY 925, there is an element that refers to a cell PIXEL 926 of the pixel array by AREF. It is within this element AREF that the pitch of repetitions in the X and Y directions and the number of repetitions is specified.

With this element AREF or the element TEXT, a flag STRANS, indicating the data direction, may be specified. With this flag STRANAS, the angle of mirroring inversion or rotation may be specified, while the figure or the character may be located in desired orientations.

The pixel-based cell PIXEL 926 is also made up of a plurality of elements. The pixel electrodes, active elements or the wirings are specified by the combinations of PATH, BOX or BOUNDARY. This cell PIXEL frequently refers to another cell indicating a pixel electrode, provisionally termed ‘ELPIX’ 927.

The cell ELPIX 927, indicating the pixel electrode, includes an element 935 indicating the shape of the pixel electrode.

Among species of the design information of a substrate for a display device, there are, in addition to the pixel array;

a cell for specifying a pad used for connection to outside, and a cell specifying the routing of wirings within the substrate of the display;

a cell stating various marks used in a variety of processes or tests; and. The structure is complex and the number of data is many.

In testing, the pixel electrodes are tested variably, and the results are saved at the end of test. In starting a test during this process, (A) the information for comprehending the layout of a target area for test in the substrate under test;

(B) the information on the connection between pixels and wirings in the target area; and (C) the layout and the shape of the respective pixels are needed.

At the end of the test, the test results of the respective pixel electrodes are crucial. That is, the volume of the information actually needed for testing is small in contrast to complexity of the design information.

Referring to FIG. 35, the species of the information needed for testing include the information within a pixel reference element in the DISPLAY cell 925, such as pitch of repetition, and a flag (STRANS) indicating the data orientations;

a flag indicating the data orientations in a pixel electrode reference element in the pixel indicating cell PIXEL 926 (and the information on the pitch of repetition in case the constitution within the pixel is that of repetition); and an element 935 within the pixel electrode indicating cell ELPIX 927, which element 935 indicates the shape of a pixel electrode.

It is because the information on the layouts of the pixel electrodes may be obtained on the basis of the above information.

The information on the shape of the outer profile of the display area of the object under test may also be prepared on the basis of the same information.

The information on the connection within a pixel may be comprehended from the relationship between the element referring to a pixel electrode cell of the pixel indicating cell PIXEL and an element describing and referring to another wiring or transistor.

The information needed for testing includes the information on the outer rim of the display area;

the information on the shape and the connection of the pixel as a unit of repetition and a set or group of the pixels; and the information on points of origin of repetitions, mirroring inversion or repetitions, pitch of the repetitions, presence or absence of mirroring inversion or the angle of rotation.

These species of the design information are needed, whenever the units of repetitions or the pitch etc. have different multiple repetitive structures.

In the present Exemplary Embodiment, the design information is transformed into the information needed for tests. Several techniques may be used for this transformation. More specifically, a first one of the techniques performs the operations from the design information in terms only of software to transform the information into the information needed for test.

This first technique may appear to be similar to the processing, now widely used, of extracting the connection information from the layout information to transform the information into that on connection, that is, a net list. The first technique however differs appreciably from this conventional processing in that the first technique contains not only the information on the connection (net list) but also the information on the shape information of respective pixels.

Moreover, the present technique differs from the conventional extraction technique or from the other conventional technique of contrasting the layout information to the net list, and has the information on the layout such as repetition information and on the outer peripheral shape of the display area.

A second technique separately provides and processes the information that supports the analysis in transformation (analysis support information) in addition to the design information. A variety of species of the information, such as data indicating the relationship of connections, may be used as this analysis support information. If the information for contrasting data corresponding to the connection information, extracted from the conventional layout information, that is, the net list, to the layout, has been obtained, such information may directly be used. As other species of the analysis support information, unit structures of repetition;

directions of repetition; and the pitch of repetition may be specified.

There are cases where a repetitive structure of a larger number of units than a repetitive structure specified in the design information is used as a basic unit of repetition. An example of such case is one where the repetitive structure specified in the design information is one pixel and the repetitive structure used is six pixels. In such case, the information on the repetitive structure is specified as the analysis support information for shortening the time needed for the analysis from the design information, which is executed for example by a dedicated software.

Heretofore, in the GDSII format, used thus far, only the repetition in terms of XY is supported, while repetition at optional angular directions is not specified.

Thus, the transformation may be carried out at a higher speed if, in the case of a structure shown in FIG. 15, the angular direction, for example, is afforded by the analysis support information FIG. 36 shows, in a block form, a configuration resulting from addition of the second technique to the block diagram of FIG. 12.

The analysis support information is entered and put to operations with the design DB 101 that stores the design information. This implements a transformation 121 of the design information.

The result is stored on a transformation DB 120. The ensuing processing is carried out using this transformation DB 120 in place of the design DB 101.

In FIG. 36, the configuration employing the design DB 101 is shown. It is also possible to directly carry out transformation 121 of the design information from the design information and the analysis support information without using the design DB 101.

FIG. 37 shows the flow of the test in case the second technique is applied to the test flow of FIG. 17.

The step S2 of inputting the analysis support information and the step S3 of transforming the design information are added, while the information used for the step S4 of calculating the area under test or the step S5 of calculating the weighting information is changed from the design information to the as-transformed information.

By these techniques, it is possible to reduce the data volume as well as to speed up the accessing to the information needed for testing such as to improve the test efficiency.

Specified Example 1

As a more detailed Example, an Exemplary Embodiment in which more advanced weighting than that described above in connection with Exemplary Embodiment 3 is applied is now described. In the following Exemplary Embodiment, weighting is applied, as such advanced weighting, in which the influence of peripheral pixels on the weighting is taken into account, as is done in a low-pass filter used for image processing. That is, the information as to the whereabouts of the peripheral pixels is used to take the influence related with the locations of the peripheral pixels into account. Such an instance is shown in FIG. 22.

FIG. 22 shows an instance of weighting on the capacitance of the center pixel and its eight neighboring pixels. In this instance, the capacitance of the pixel under test and the parasitic capacitances of the neighboring pixels are calculated with the weighting indicated in the drawing.

In FIG. 22, c/n is a weighting coefficient for the center pixel. The weighting coefficients for the pixels on the upper and lower sides and on the left and right sides of the center pixel are $b_{12}/n$, $b_{21}/n$, $b_{23}/n$ and $b_{32}/n$, where $b_{12}$, $b_{21}$, $b_{23}$ and $b_{32}$ are numbers approximately equal one to another.

On the other hand, the weighting coefficients for the obliquely positioned pixels are $a_{11}/n$, $a_{13}/n$, $a_{31}/n$ and $a_{33}/n$, where $a_{11}$, $a_{13}$, $a_{31}$ and $a_{33}$ are numbers approximately equal one to another.

Meanwhile, n may be expressed by the following equation (5):

$$n=a_{11}+a_{13}+a_{31}+a_{33}+b_{12}+b_{21}+b_{23}+b_{32}+c \quad (5)$$

The nine coefficients of FIG. 22 sum up to 1. Hence, operations for weighting that take the influence of the neighboring parasitic capacitances into account are made possible.

If there lacks one or more neighboring pixel(s), the coefficient(s) of the pixels under test are removed and the numbers of the total of the remaining pixels are made to sum up to unity. For example, should there be no three rightmost pixels, the denominator of the coefficients used for weighting is set to $$n=a_{11}+a_{31}+b_{12}+b_{21}+b_{32}+c \quad (6)$$

In FIG. 22, the coefficient(s) of the pixels under test remain to be c/n. However, the denominator changes from the equation (5) to the equation (6).

The center pixel, the pixels lying on its upper and lower sides and on its left and right sides, and the pixels lying on the oblique positions relative to the center pixel, have differential influences on the parasitic capacitance. The respective coefficients are, therefore, usually set so that $$0\le a_{11}\approx a_{13}\approx a_{31}\approx a_{33}<b_{12}\approx b_{21}\approx b_{23}\approx b_{32}<c \quad (7)$$

Depending on the pixel layout, the coefficients on the oblique positions ($a_{11}$, $a_{13}$, $a_{31}$ and $a_{33}$) differ one from another, while those on the upper and lower sides and on the left and right sides ($b_{12}$, $b_{21}$, $b_{23}$ and $b_{32}$) also differ one from another.

In the simplest case, the coefficients may be regarded to be the same insofar as the pixels of the two directions are concerned. By way of an example, FIG. 23 shows weighting in which $a_{11}=a_{13}=a_{31}=a_{33}=1$, $b_{12}=b_{21}=b_{23}=b_{32}=2$ and c=4. In this case, n=16.

If three rightmost pixels of FIG. 23 are lacking, n=12 in accordance with the equation (6). The coefficient of the center pixel under test is 4/12. By using the weighting in this manner, it becomes possible to take the influence of the parasitic capacitances of the peripheral pixels into account.

Specified Example 2

As another specific Example 2, in which weighting different from the specific Example 1 is applied to the Exemplary Embodiment 3 of the present invention will now be described. Here, a method similar to one used in a high-pass filter used for image processing, that is, a method of taking a difference of weighted measured data of a pixel of interest and weighted measured data of peripheral pixels, is used. This method should remove the influence from the peripheral pixels as the failed pixel is emphasized.

That is, the information on whereabouts of the peripheral pixels is used, measured data per se are weighted and a difference is taken of the measured data, whereby the influence by the locations of the peripheral pixels is removed. An example is shown in FIG. 24.

FIG. 24 shows an example of weighting for the center pixel and its eight peripheral pixels. Referring to FIG. 24, the center pixel and its peripheral pixels differ in the signs (plus or minus) of the coefficients.

It is observed that m stands for the weighting coefficient for the center pixel.

The weighting coefficients for the pixels lying on its upper and lower sides and on its left and right sides are equal to one another and $l_{12}$, $l_{21}$, $l_{23}$ and $l_{32}$, respectively.

The weighting coefficients for the pixels lying at the oblique positions relative to the center pixel are equal to one another and $k_{11}$, $k_{13}$, $k_{31}$ and $k_{33}$, respectively.

Among the respective coefficients, there exists the following relationship:

$$m=k_{11}+k_{13}+k_{31}+k_{33}+l_{12}+l_{21}+l_{23}+l_{32}+1 \quad (8)$$

There also exists among the coefficients the following relationship:

$$0\le k_{11}\approx k_{13}\approx k_{31}\approx k_{33}<l_{12}\approx l_{21}\approx l_{23}\approx l_{32}<m \quad (9)$$

From the equation (8), the total of the nine coefficients of FIG. 24 sums up to unity. Thus, the operations for weighting, which take account of the magnitude of the influence of the neighboring pixels, with the aid of the measured data of the respective pixels, are made possible.

In the present Example, measured data of an object for test and those of the neighboring pixels are multiplied with the weights shown in the drawing by way of performing the operations for weighting. The resulting sum is used as measured data of the pixel under test following the weighting.

If, with the present method, there lack(s) one or more pixel(s), the coefficient of the pixel is removed and a value equal to the sum of the coefficients of the neighboring pixels plus unity is used as the weighting coefficient for the center pixel. For example, should there be no three rightmost pixels on the right side of FIG. 24, the coefficient of the pixel under test may be obtained by the following equation (10):

$$m=k_{11}+k_{31}+l_{12}+l_{21}+l_{32}+1 \quad (10)$$

Depending on the pixel layout, the coefficients on the oblique positions ($k_{11}$, $k_{13}$, $k_{31}$ and $k_{33}$) differ one from another, while those on the upper and lower sides and on the left and right sides ($l_{12}$, $l_{21}$, $l_{23}$, $l_{32}$) also differ one from another.

In the simplest case, the coefficients may be regarded to be the same insofar as these two pixel directions are concerned. By way of an example, FIG. 25 shows weighting in which $k_{11}=k_{13}=k_{31}=k_{33}=0$, and $l_{12}=l_{21}=l_{23}=l_{32}=1$. In this case, m=5.

If there be no three rightmost pixels of FIG. 25, m=4 in accordance with the equation (10). With this method, a defect, if any, may be detected acutely, that is, to high sensitivity, as will now be described.

For simplicity, the state of FIG. 24, where all of eight pixels around an object under test exist, will now be described. If the same data X has been written in the total of the pixels, and there is no defect in the pixels, data measured at the eight peripheral pixels are multiplied with the weighting coefficients of FIG. 24 and the resulting products are summed together. Ideally, the detected values at the total of the peripheral pixels should be X. This should yield $$-(k_{11}+k_{13}+k_{31}+k_{33}+l_{12}+l_{21}+l_{23}+l_{32})\cdot X \quad (11)$$

If the equation (8) is applied to the expression (11), the expression (8) may be made simpler and is $$(1-m)X$$

X is written in the center pixel which is the object under test. This X is multiplied by a corresponding coefficient to yield mX.
If the values of the peripheral pixels and the center pixel following the weighting are summed together, $$(1-m)X+mX=X$$

so that X that should inherently be measured may be detected.

It is now assumed that the center pixel suffers from a defect and data of the center pixel has changed to Y due to the presence of that defect. At this time, the sum of the values following the weighting is $$mY-(m-1)X=X$$

Since m>m−1, the information (Y) relevant to the defect present at the center pixel is emphasized in comparison with the information (X) of the peripheral pixels not suffering the defect. This should enable facilitated detection of defects.

On the other hand, it is assumed that one of pixels neighboring to the center pixel on its upper and lower sides and on its left and right sides, such as the right side neighbor of the center pixel in FIG. 24, suffers from a defect.

At this time, the sum of the values following the weighting is $$mX-(m-1-1_{23})X-1_{23}Y=(1_{23}+1)X-1_{23}Y$$

In this case, $l_{23}+1>l_{23}$. Hence, the information (X) of the non-defective center pixel is emphasized in comparison with the information (Y) of the defective peripheral pixels. The non-defective pixels may thus be detected without being influenced by the presence of defects.

What has been described above will now be explained in more detail.

If there is a defect at the center, the above sum value is $$5Y-4X.$$

The coefficient relating to the defective information (Y) is 5 which is larger than 4 of the non-defective information (X). The defective information (Y) may thus be detected acutely.

If there is a defect on the right neighboring side of the center pixel, the above sum value is $$2X-Y.$$

Since the coefficient relating to the non-defective information (X) is larger, the non-defective pixels may be detected without being influenced by the presence of the defects.

Specified Example 3

The specific Example 3 corresponds to the Exemplary Embodiment 3 of the present invention in which weighting similar to that in the specific Example 2 is applied and in which the influence of the information relating to the defect is moderated.

In the present specific Example 3, the information relating to the defect of the neighboring pixels is subtracted. Thus, the influence of the surrounding defects on the real center pixel, if any, may be reduced. This point will now be described in detail with the aid of FIG. 26.

FIG. 26 shows data detected in a 5×6 pixel array. It is assumed that a single defective pixel exists, with the remaining pixels being normal pixels. Since there is a defect in a pixel denoted by r, the surrounding pixels are influenced by weighting in the same way as explained with reference to FIG. 26.

In this specific Example, data of a non-defective normal pixel, inherently detected when the pixel is not influenced by surrounding pixels, is denoted by X, and data of a defective pixel, inherently detected when the pixel is influenced by surrounding pixels, is denoted by Y. As a result, data detected in case these pixels are measured, are data shown in FIG. 26.

Data of pixels denoted as $\alpha_{11}$, $\alpha_{13}$, $\alpha_{31}$, $\alpha_{33}$ and $\beta_{12}$, $\beta_{21}$, $\beta_{23}$, $\beta_{32}$, and data of the defective pixel denoted as $\gamma$, may be expressed, using the coefficients of FIG. 26, and X and Y, by:

$$\alpha_{11}=(1-\rho)X+\rho\frac{(n-a_{33})X+a_{33}Y}{n} \quad (12)$$

$$\alpha_{13}=(1-\rho)X+\rho\frac{(n-a_{31})X+a_{31}Y}{n} \quad (13)$$

$$\alpha_{31}=(1-\rho)X+\rho\frac{(n-a_{13})X+a_{13}Y}{n} \quad (14)$$

$$\alpha_{33}=(1-\rho)X+\rho\frac{(n-a_{11})X+a_{11}Y}{n} \quad (15)$$

$$\beta_{12}=(1-\rho)X+\rho\frac{(n-b_{32})X+b_{32}Y}{n} \quad (16)$$

$$\beta_{21}=(1-\rho)X+\rho\frac{(n-b_{23})X+b_{23}Y}{n} \quad (17)$$

$$\beta_{23}=(1-\rho)X+\rho\frac{(n-b_{21})X+b_{21}Y}{n} \quad (18)$$

$$\beta_{32}=(1-\rho)X+\rho\frac{(n-b_{12})X+b_{12}Y}{n} \quad (19)$$

$$\gamma=(1-\rho)Y+\rho\frac{(n-c)X+cY}{n} \quad (20)$$

In the above equations (12) to (20), $\rho$ denotes a proportion indicating the influence by the parasitic capacitance from the neighboring pixels on data being measured of the pixel under test, and takes on values ranging from 0 to 1 ($0<\rho<1$).

The above equations (12) to (20) indicate that the influences from the parasitic capacitances of the respective pixels are acting such that the data being measured is influenced by the parasitic capacitances.

In the absence of defects in the neighboring pixels, the values of the equations (12) to (20) all become equal to X.

Meanwhile, the equation (20) for γ is postulated on the presence of the defect in the pixel for it and hence is to be treated differently. The equation is equal to X in case the pixel is non-defective and the total of the peripheral pixels is normal.

In FIG. 26, data obtained on measuring the left-side neighbor of the pixel denoted as γ becomes $\beta_{21}$, shown by the equation (17), under the influence of the parasitic capacitance.

Next, measured data ($\beta_{21}$) of the pixel is put to the operations for weighting shown in FIG. 24. That is, the weighting of FIG. 24 is applied to the pixel denoted as $\beta_{21}$ and surrounding 3×3=9 pixels. We have the following expression (21):

$$\frac{(n\cdot i-\rho\cdot j)X+\rho\cdot jY}{n}-l_{23}(1-\rho)Y \tag{21}$$

In the above expression, i and j may respectively be given by the equations (22) and (23):

$$i=m-k_{11}-k_{31}-l_{21}-k_{13}-k_{33}-l_{12}-l_{32}-l_{23} \tag{22}$$

$$j=mb_{23}-k_{13}b_{32}-k_{33}b_{12}-l_{12}a_{33}-l_{32}a_{13}-l_{23}c \tag{23}$$

As is clear from the comparison of $\beta_{21}$ of the equation (21) with the weighted data of the equation (21), with the weighted data, the information by the defect, that is, the term relating to Y, is really subtracted.

This reduces the influence by the defect and emphasizes the information of the pixels other than the defective pixel (term relating to X). A correct result may thus be obtained reliably should there exist influences from the parasitic capacitances.

On the other hand, data obtained on measuring the pixel suffering the defect becomes γ shown in the equation (20) under the influence of the parasitic capacitances. The measured data then is put to the operations for weighting shown in FIG. 24. That is, if the weighting of FIG. 24 is applied to the pixel (γ) of FIG. 26 and to the surrounding 3×3=9 pixels, the following expression (24) is obtained.

$$\left[\frac{n-h}{n}\rho+(1-m)(1-\rho)\right]X+\left[\frac{h}{n}\rho+m(1-\rho)\right]Y. \tag{24}$$

In the above expression, h is given by the following equation:

$$h=mc-k_{11}a_{33}-k_{13}a_{31}-k_{31}a_{13}-k_{13}a_{11}-l_{12}b_{32}-l_{21}b_{23}-l_{23}b_{21}-l_{32}b_{12} \tag{25}$$

As is clear from the comparison of γ of the equation (20) with the weighted data of the equation (24), with the weighted data, the information by the defect (Y) is enlarged by the coefficient m. It is observed that m is necessarily greater than 1 (m>1) from the equations (8) and (9) as long as the coefficients k and l are of finite magnitudes.

Thus, the defect information of a defective pixel is enlarged to make it easy to recognize a defect.

What has been described above will now be described in more detail using the coefficients of FIGS. 23 and 25. Specifically, coefficients of FIGS. 23 and 25, which are more concrete numbers than those of FIGS. 22 and 24 used in deriving the equations (12) to (25), as a result of which the values of respective pixels of FIG. 26 may be represented more concretely with the aid of equations. It is envisaged to measure the pixel denoted by $\beta_{21}$ of FIG. 26 and to perform the above-described operations for weighting.

By operations of the equation (21), with the aid of the coefficients of FIGS. 23 and 25, the following expression (26) is derived.

$$\left(1-\frac{1}{4}\rho\right)X+\left(-1+\frac{3}{4}\rho\right)Y \tag{26}$$

On the other hand, the value $\beta_{21}$, directly measured, is given by the following expression (27):

$$\left(1-\frac{1}{8}\rho\right)X+\frac{1}{8}\rho\cdot Y \tag{27}$$

In the expression (27) by direct measurement, the influence from the defect is added. Conversely, in the expression (26) for operations for weighting, the influence from the defect is subtracted.

Thus, with the present Exemplary Embodiment, the influence from the defect is eliminated from the normal pixel.

On the other hand, if the pixel γ, suffering the defect, is measured, and put to the above-described operations for weighting, a value $$Y+\frac{16-17\rho}{4}(Y-X) \tag{28}$$

is obtained from the expression (24).

In the expression (28), the information for the defect (Y) is summed with a value relating to a difference (X−Y) between the information for the defect (Y) and the information for the non-defect (X).

That is, the information for the defect is emphasized, while the influence from the normal pixel is subtracted and tends to be eliminated. Thus, according to the present invention, selection of the normal and defective pixels may be facilitated.

On the other hand, the value γ as directly measured is expressed by the following expression (29):

$$Y-\frac{3\rho}{4}(Y-X) \tag{29}$$

With this result by direct measurement (equation (29)), the value relating to the difference (X−Y) between the information for the defect (Y) and the information for the non-defect (X) is subtracted from the information for the defect (Y).

That is, the information on the defect is summed with the influence from the normal pixel. Thus, only the contribution of the information on the defect (Y) less than the value (Y) that may be expected in case the total of the neighboring pixels is defective may be detected. This should render decision of the defective pixel difficult.

Thus, should there be an influence from the neighboring pixels, discrimination of the information on the defect is rendered difficult. Conversely, with the invention of the present invention, the information on the defect is emphasized, as may be seen from the expression (28), thus assuring facilitated defect discrimination.

With the explanation, made thus far, pixels are arrayed in a square, with the same pitch of pixels for the horizontal and vertical directions. However, the pitch of pixels in the horizontal direction may differ from that in the vertical direction.

Each pixel unit, composed of a pixel, a TFT and associated wirings, need not be rectangular in shape, and may be of various other shapes. Although the total of the pixel units may be the same in shape, pixel units of diverse shapes may be combined together to form a set of pixel units.

Moreover, the pixels may be different in shape one from another.

As an example of shape variations of pixel units, the configuration shown in FIG. 15 may be used. Each pixel unit may be composed of six triangular-shaped pixels together forming a hexagonal pixel.

The present invention may comprise such a display configuration in which a center portion has the shape or the layout density differing from those of the peripheral portion.

The information on the pixel shape or the layout information may be used as the design information. This leads to outstanding results such that (I) a signal for detection, such as an electron beam, is not applied, during testing a given pixel, to other neighboring pixels; or (II) a signal for detection, such as an electron beam, is not applied to an area outside the display area where there exist no pixels.

With the test apparatus of the present invention, not only a display device having a non-rectangular display area, but also a display having a rectangular display area, may be tested satisfactorily. With the display having a rectangular display area, it is possible to use the design information to set the range of testing or analysis as well as to execute operations for weighting such as to take the effect of the parasitic capacitance at an outer rim of the display area into account. The result is that the test efficiency as well as accuracy in analysis of test results may be improved even in case of testing of the conventional display having a rectangular display area.

With the method and the device for testing, according to the present invention, employing the design information, specific pixel structures may be coped with. The method and the device for testing according to the present invention may be applied not only to a display having pixels of differing shape or size, but also to a display of the type in which a counter-electrode is arranged within a pixel, such as an in-plane switching (IPS) system.

Testing may be conducted even in case a protrusion for controlling the orientation or the gap is provided within a pixel.

Testing may also be conducted in case there is provided an electrode that exercises control not from a TFT directly but via an electrode.

Testing may be conducted in case there are provided a plurality of TFTs and a plurality of pixel electrodes, or in case a memory for holding data to be displayed is provided in a pixel of a pixel structure.

Testing may further be conducted in case a circuit, such as an amplifier, is provided within the pixel of a pixel structure shown in JP Patent In addition, testing may be conducted in case a plurality of TFTs are provided in a pixel of a pixel structure for driving light-emitting elements, such as OLED (organic EL).

That is, the substrate of a display, tested by the present invention, may be for a liquid crystal display, an OLED display or an electronic paper, without regard to its structure. In addition to the substrate of a display, an X-ray sensor having a non-rectangular sensor area, an IR sensor, or a substrate for fingerprint readout, having a non-rectangular display area, may also be tested. The present invention may be applied to a substrate used for a bio-chip, for example.

The foregoing description is postulated on inputting the design information. If the design information is not available, the shape of the display area on a sample or pixel layout may be obtained on measurement. In the test apparatus of the present invention, it is also possible to change the beam used in ordinary testing, the angle or the intensity of the beam, or the shape and/or the size of a spot of the electronic beam, in the course of step 1, to effect scan to change the shape of the display area or measure the pixel location.

According to the present invention, an inspection device may be provided which is able to conduct efficient testing of a display device having a non-rectangular display area. A substrate of a display, inspected by a test apparatus capable of efficiently testing a display device having a non-rectangular display area, and the test apparatus, may also be provided. Furthermore, a test apparatus may be provided which is capable of testing a substrate having a pixel structure and a non-rectangular active region and which may be used as a sensor, and a sensor having the so tested substrate, may also be provided.

According to the present invention, the dummy pixel may be excluded from an object under test so that the efforts for excluding information regarding the dummy pixel from the test result can be dispensed with. In the present invention, testing on the outer peripheral part may be more accurate in case the dummy pixel layout information is used to determine the weighting at the outer peripheral part. In addition, according to the present invention, the storage capacity needed in storing the design information may appreciably be reduced, while the test results may be saved with a data structure matched to the pixel structure proper to the display device having a non-rectangular display area.

According to the present invention, the display device substrate having non-rectangular display area with the defects information is easily obtained. In addition, the display device having non-rectangular display area with no or few defects is obtained.

The disclosures of the aforementioned Patent Documents are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

What is claimed is:

1. A method for testing a substrate for a display device, the method comprising:

inputting design information for the display device;

specifying at least one of a target area for test and a target area for analysis in the substrate, based on the design information;

generating weighting information for a detection result by test, based on the design information;

performing operation on the detection result of test of an object under test in the substrate and the weighting information; and making a decision on pass/fail of the object under test in the substrate from the weighted detection result and a preset threshold value, wherein the design information includes a first array information regarding a center part made up of pixels of a rectangular shape and pixels of a non-rectangular shape arranged around the center part in a display area of a non-rectangular shape.

2. The method according to claim 1, comprising in generating the weighting information based on the design information, utilizing, among the design information, at least one of:

information on the number of pixels connected to a wiring of the substrate; and information on number of pixels around a pixel under test or locations of the pixels around the pixel under test.

3. The method according to claim 1, further comprising:

controlling an arrangement and/or a number of electron beam spots to be irradiated on pixels on the target area for test of the substrate in accordance with pixels and a shape of an outer peripheral part of the substrate, based on the shape of a pixel electrode of an outer peripheral part; and irradiating an electron beam on the target area for test of the substrate and detecting secondary electrons emitted from the substrate to produce a detection result for the test.

4. The method according to claim 1, further comprising:

performing two-dimensional weighting for a given pixel and pixels neighboring thereto on the substrate; and emphasizing, by the two-dimensional weighting, information regarding a defect present in the given pixel in comparison with information regarding peripheral non-defective pixels to facilitate defect detection.

5. The method according to claim 1, further comprising:

performing two-dimensional weighting for a given pixel and pixels neighboring thereto on the substrate; and emphasizing, by the two-dimensional weighting, information regarding a defect present in the given pixel in comparison with information of neighboring non-defective pixels to enable detection of non-defective pixels, without being influenced by the presence of defects in the neighboring pixels.

6. The method according to claim 1, further comprising:

performing two-dimensional weighting for a given pixel and pixels neighboring thereto on the substrate; and deducting, by the two-dimensional weighting, information regarding a defect of pixels neighboring to the given pixel to reduce the influence of a peripheral defective pixel or pixels on the given pixel which is non-defective.

7. The method according to claim 6, further comprising:

emphasizing information regarding a defect of the given pixel to reduce an influence from a normal pixel.

8. The method according to claim 1, comprising in generating the weighting information based on the design information, utilizing information of a dummy pixel neighboring to a pixel in the target area for test.

9. The method according to claim 1, further comprising:

determining whether or not a dummy cell is included in a target area for test, based on the design information which includes arrangement information of dummy cells provided in the display area.

10. The method according to claim 1, wherein a number of peripheral pixels around each pixel of a plurality of pixels ranges from 1 to 8.

11. A method for testing a substrate for a display device, the method comprising:

inputting design information for the display device;

specifying at least one of a target area for test and a target area for analysis in the substrate, based on the design information;

generating weighting information for a threshold value by which pass/fail of an object under test in the substrate is decided, based on the design information;

performing operation on the threshold value and the weighting information; and making a decision on pass/fail of the object under test in the substrate from a detection result of test of the object under test in the substrate and the weighted threshold value, wherein the design information includes information regarding a center part made up of pixels of a rectangular shape and pixels of a non-rectangular shape arranged around the center part in a display area of a non-rectangular shape.

12. An apparatus for testing a substrate for a display device, the apparatus comprising:

a measurement unit that conducts measurement for test of the substrate for the display device including a plurality of pixels in a display area of a non-rectangular shape; and an operation unit that inputs design information for the display device and that specifies at least one of a target area for test and a target area for analysis in the substrate, based on the design information, wherein the design information includes a first array information regarding a center part made up of pixels of a rectangular shape and pixels of a non-rectangular shape arranged around the center part in a display area of a non-rectangular shape, and wherein the operation unit comprises:

a unit that generates weighting information based on the design information;

a unit that performs operation on a detection result of test of an object under test in the substrate conducted by the measurement unit and the weighting information; and a unit that makes a decision on pass/fail of the object under test in the substrate from the weighted detection result and a preset threshold value.

13. The apparatus according to claim 12, wherein the unit that generates the weighting information based on the design information, utilizes, among the design information, at least one of:

information on the number of pixels connected to a wiring of the substrate; and information on the number of pixels around a pixel under test or locations of the pixels around the pixel under test.

14. The apparatus according to claim 12, wherein the operation unit controls an arrangement and/or a number of electron beam spots to be irradiated on pixels on the target area for test of the substrate in accordance with pixels of an outer peripheral part of the substrate and a shape of the outer peripheral part of the substrate, based on the shape of a pixel electrode of an outer peripheral part, and wherein the measurement unit, under the control of the operation unit, irradiates an electron beam on the target area for test of the substrate and that detects secondary electrons emitted from the substrate to produce a detection result of test for output to the operation unit.

15. The apparatus according to claim 12, wherein, when generating the weighting information based on the design information, the operation unit utilizes information of a dummy pixel neighboring to a pixel in the target area for test.

16. The apparatus according to claim 12, wherein the operation unit comprises a unit that determines whether or not a dummy cell is included in a target area for test, based on the design information which includes arrangement information of dummy cells provided in the display area.

17. An apparatus for testing a substrate for a display device, the apparatus comprising: an operation unit that inputs design information for the display device and that specifies at least one of a target area for test and a target area for analysis in the substrate, based on the design information, wherein the operation unit comprises: a unit that generates weighting information for a preset threshold value by which pass/fail of an object under test in the substrate is decided, based on the design information; a unit that performs operation on the threshold value and the weighting information; and a unit that makes a decision on pass/fail of the object under test in the substrate from a detection result of test of the object under test in the substrate conducted by the measurement unit and the weighted threshold value, and wherein the design information includes information regarding to a center part made up of pixels of a rectangular shape and pixels of a non-rectangular shape arranged around the center part in a display area of a non-rectangular shape.

18. A method for testing a substrate for a display device, the method comprising:

inputting design information for the display device;

specifying at least one of a target area for test and a target area for analysis in the substrate, based on the design information;

generating weighting information based on the design information;

performing operation on a detection result of test of an object under test in the substrate and the weighting information; and making a decision on pass/fail of the object under test in the substrate from the weighted detection result and a preset threshold value, wherein the design information includes a first array information regarding a center part made up of pixels of a rectangular shape and pixels of a non-rectangular shape arranged around the center part in a display area of a non-rectangular shape, and wherein in generating the weighting information based on the design information, utilizing, among the design information, at least one of:

information on the number of pixels connected to a wiring of the substrate; and information on number of pixels around a pixel under test or locations of the pixels around the pixel under test.

19. An apparatus for testing a substrate for a display device, the apparatus comprising:

a measurement unit that conducts measurement for test of the substrate for the display device including a plurality of pixels in a display area of a non-rectangular shape; and an operation unit that inputs design information for the display device and that specifies at least one of a target area for test and a target area for analysis in the substrate, based on the design information, wherein the design information includes a first array information regarding a center part made up of pixels of a rectangular shape and pixels of a non-rectangular shape arranged around the center part in a display area of a non-rectangular shape, wherein the operation unit comprises:

a unit that generates weighting information based on the design information;

a unit that performs operation on a detection result of test of an object under test in the substrate conducted by the measurement unit and the weighting information; and a unit that makes a decision on pass/fail of the object under test in the substrate from the weighted detection result and a preset threshold value, and wherein the unit that generates the weighting information based on the design information, utilizes, among the design information, at least one of:

information on the number of pixels connected to a wiring of the substrate; and information on the number of pixels around a pixel under test or locations of the pixels around the pixel under test.

20. A method for testing a substrate for a display device, the method comprising:

inputting design information for the display device;

specifying at least one of a target area for test and a target area for analysis in the substrate, based on the design information;

generating weighting information for a detection result by test, based on the design information;

performing operation on the detection result of test of an object under test in the substrate and the weighting information; and making a decision on pass/fail of the object under test in the substrate from the weighted detection result and a preset threshold value, wherein the design information includes information regarding to a repetitive pattern of sets of pixels and one or more pixels isolated from the sets of pixels in a display area of a non-rectangular shape, and wherein a form of the sets of pixels is a non-rectangular shape.

* * * * *